US009982661B1

(12) United States Patent
Trigwell et al.

(10) Patent No.: US 9,982,661 B1
(45) Date of Patent: May 29, 2018

(54) PASSIVE THERMAL MANAGEMENT SYSTEMS EMPLOYING SHAPE MEMORY ALLOYS

(71) Applicant: The United States of America as Represented by the Administrator of the National Aeronautics and Space Adm., Washington, DC (US)

(72) Inventors: Steven Trigwell, Merritt Island, FL (US); James E. Fesmire, Titusville, FL (US); Tracy L. Gibson, Melbourne, FL (US); Martha K. Williams, Titusville, FL (US)

(73) Assignee: The United States of America as Represented by the Administrator of NASA, Washington, DC (US)

( * ) Notice: Subject to any disclaimer, the term of this patent is extended or adjusted under 35 U.S.C. 154(b) by 1115 days.

(21) Appl. No.: 14/205,250

(22) Filed: Mar. 11, 2014

Related U.S. Application Data

(60) Provisional application No. 61/776,677, filed on Mar. 11, 2013.

(51) Int. Cl.
*F28F 5/00* (2006.01)
*H05K 7/20* (2006.01)
(Continued)

(52) U.S. Cl.
CPC ............... *F03G 7/065* (2013.01); *F28F 5/00* (2013.01); *H05K 7/20* (2013.01); *F28F 2013/008* (2013.01)

(58) Field of Classification Search
CPC ...... F03G 7/065; F03G 5/00; F28F 2013/008; H05K 7/20
(Continued)

(56) References Cited

U.S. PATENT DOCUMENTS

| 2,949,283 A | * | 8/1960 | Smith | ................. F28F 1/12 165/180 |
| 3,177,933 A | * | 4/1965 | Webb | ................. F28F 13/00 165/287 |

(Continued)

OTHER PUBLICATIONS

Xiabao Geng, et al., "A self-adaptive thermal switch array to stabilize the temperature of MEMS devices", Micro Electra Mechanical Systems (MEMS), 2010 IEEE 23rd International Conference on, Jan. 24-28, 2010, pp. 148-151, IEEE Xplore, USA.
(Continued)

*Primary Examiner* — Anatoly Vortman
(74) *Attorney, Agent, or Firm* — Jonathan J. Leahy; Michelle L. Ford; Mark P. Dvorscak

(57) ABSTRACT

A thermal management system includes a first substrate having a first conductive inner surface. A second substrate has a second conductive inner surface. A connecting structure is attached to the first and second substrates to space apart the first and second inner surfaces defining an insulating space for a single architecture. One or more passively-acting elements are attached to the inner surface of at least one substrate and including a shape memory material such as a shape memory alloy (SMA). The SMA passively reacts to the temperature of the first substrate by thermally contacting or separating from the second inner surface of the second substrate for the control of the conduction of heat energy in either direction.

30 Claims, 21 Drawing Sheets

(51) Int. Cl.
*F03G 7/06* (2006.01)
*F28F 13/00* (2006.01)

(58) Field of Classification Search
USPC .......................................................... 361/704
See application file for complete search history.

(56) References Cited

U.S. PATENT DOCUMENTS

| | | | | |
|---|---|---|---|---|
| 3,225,820 A | * | 12/1965 | Riordan | F25D 19/006 165/96 |
| 3,430,455 A | * | 3/1969 | Hogan | F17C 13/00 165/287 |
| 3,489,203 A | * | 1/1970 | Fischell | B64G 1/506 165/104.26 |
| 4,099,991 A | | 7/1978 | Pops et al. | |
| 5,379,601 A | * | 1/1995 | Gillett | F25D 19/006 165/275 |
| 5,875,096 A | * | 2/1999 | Gates | H01L 23/10 165/80.3 |
| 6,278,607 B1 | * | 8/2001 | Moore | G06F 1/203 361/679.54 |
| 6,333,772 B1 | * | 12/2001 | Mori | G02F 1/133382 349/161 |
| 6,608,752 B2 | * | 8/2003 | Morris | H01L 23/34 165/104.33 |
| 6,628,522 B2 | * | 9/2003 | Trautman | F28F 13/02 165/185 |
| 7,752,866 B2 | | 7/2010 | Vaidyanathan et al. | |
| 8,337,951 B2 | | 12/2012 | Biris et al. | |
| 8,339,787 B2 | * | 12/2012 | Tsai | G06F 1/206 165/104.33 |
| 8,659,903 B2 | * | 2/2014 | Schwartz | F25B 21/02 136/200 |
| 9,025,333 B1 | * | 5/2015 | Spowart | F28F 13/00 165/276 |
| 9,349,558 B2 | * | 5/2016 | Schwartz | H01H 37/02 |
| 2003/0085659 A1 | * | 5/2003 | Overmann | G02F 1/133385 315/32 |
| 2005/0099776 A1 | * | 5/2005 | Xue | F28D 15/0266 361/700 |
| 2009/0218087 A1 | * | 9/2009 | Oshima | C09K 5/14 165/185 |
| 2010/0065263 A1 | * | 3/2010 | Tanchon | B64G 1/58 165/277 |

OTHER PUBLICATIONS

Kapps, M. Smart-material mechanisms as actuation alternatives for aerospace robotics and automation, 2006, International Space Development Conference, Los Angeles, CA, USA.

* cited by examiner

PASSIVE THERMAL MANAGEMENT SYSTEMS EMPLOYING SHAPE MEMORY ALLOYS

CROSS-REFERENCE TO RELATED APPLICATIONS

This application claims the benefit of priority under 35 U.S.C. § 119(e) to U.S. Provisional Application Serial No. 61/776,677 entitled "Shape Memory Alloy for Switchable Thermal Management System," filed Mar. 11, 2013, the contents of which are incorporated herein by reference in their entirety.

ORIGIN OF THE INVENTION

The invention described herein was made in the performance of work under a NASA contract and by employees of the United States Government and is subject to the provisions of Public Law 96-517 (35 U.S.C. § 202) and may be manufactured and used by or for the Government of the United States of America for governmental purposes without the payment of any royalties thereon or therefore. In accordance with 35 U.S.C. § 202, the contractor elected not to retain title.

BACKGROUND OF THE INVENTION

1. Field of the Invention

The field of art disclosed herein pertains to thermal management systems, and more particularly the passive movement of heat energy between opposing surfaces by employing passive-acting elements such as shape memory materials.

2. Description of the Related Art

In its most basic form, thermal management and the control of heat energy is the maintenance of a given system's surfaces and components within an appropriate temperature range despite changing heat loads and variations in the thermal environment. Efficient thermal management systems have long been an issue for the National Aeronautics and Space Administration (NASA) in both ground and space-based aerospace applications. Earth orbiting spacecraft and space mission components require thermal stability during system operation, while future extraterrestrial bases will require heat management to control habitat temperatures, life support systems, and equipment.

Aerospace thermal management systems technology development is focused on the development of systems that reduce mass—thereby reducing the cost of spacecraft propulsion—and are capable of handling high heat loads with fine temperature control. The reduction of mass is integral with effective use of energy: the energy required to leave Earth's gravity, to provide space propulsion, to provide electrical power, to meet life support needs, to power scientific apparatus, and to power industrial production plants in future exploration bases. Additionally, with respect to cryogenic systems, solutions are especially limited due to the challenges of operating at extreme cold temperatures. However, there will continue to be a need for cryogenic systems as long as chemical propellants are the most efficient primary propulsion systems used in space. The performance and efficiency of cryogenic systems will have to significantly increase in order to enable the missions NASA hopes to undertake in the next twenty years.

Researchers have developed technologies such as gas-gap, paraffin wax thermal batteries, heat pipe systems, and differential thermal expansion thermal switches in response to the need for solutions to the specific challenges related to the high energy, energy dense, or energy efficient systems of all kinds. Some thermal switch devices have been developed for low-temperature cryostat (cryogenic) systems that can provide heat conduction at discrete points, but not broad area surfaces. However, the current systems require reliance upon active controls, sensors, pneumatics, hydraulics, powered pumps, heaters, and other complex devices which increase system mass, cost, and potential failure modes. Thus, there remains a considerable need for multi-functional, intelligent systems and methods that can offer significant mass and power savings along with increased reliability over a wide range of heat loads in varying environments.

SUMMARY OF THE INVENTION

In one aspect, the present disclosure provides a thermal management system that includes a first substrate having a first conductive inner surface. A second substrate has a second conductive inner surface. A connecting structure is attached to the first and second substrates to space apart the first and second inner surfaces defining an insulating space. One or more passively-acting elements are attached to the inner surface of the first substrate and include a shape memory material. The shape memory material passively reacts to the temperature of the first substrate by thermally contacting or separating from the second inner surface of the second substrate for the control of the conduction of heat energy.

In another aspect of the present invention, a method is disclosed for providing a transient thermal management system that transfers heat energy between two opposing surface. In one or more embodiments, the method includes providing a first substrate having a first inner surface; providing a second substrate having a second inner surface; and attaching a connecting structure to the first and second substrates to space apart the first and second inner surfaces defining an insulating space. The method further includes attaching to the inner surface of the first substrate one or more passively-acting elements that include a shape memory material that passively reacts to the temperature of the first substrate and by thermally contacting or separating from the second inner surface of the second substrate for the control of the conduction of heat energy.

These and other features are explained more fully in the embodiments illustrated below. It should be understood that in general the features of one embodiment also may be used in combination with features of another embodiment and that the embodiments are not intended to limit the scope of the invention.

BRIEF DESCRIPTION OF THE DRAWINGS

The various exemplary embodiments of the present invention, which will become more apparent as the description proceeds, are described in the following detailed description in conjunction with the accompanying drawings, in which.

DETAILED DESCRIPTION OF THE INVENTION

Figure 2:
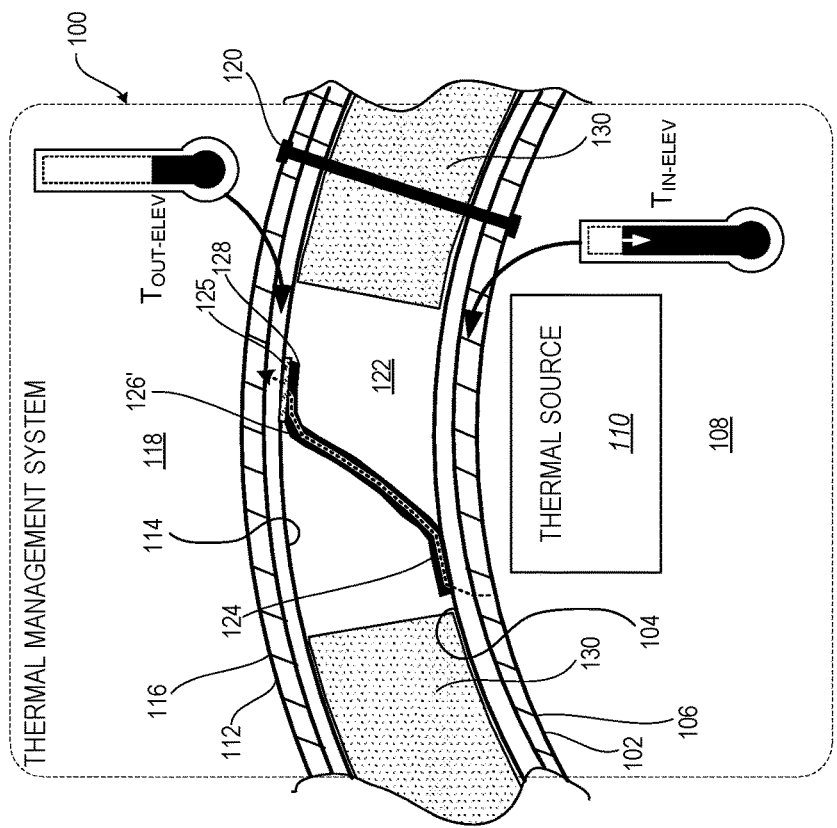
FIG. 2 illustrates a diagram of the thermal management system of FIG. 1 having the passive-acting element in a thermally-conducting shape, according to one embodiment.

The present invention employs the use of shape memory material, such as shape memory alloy (SMA), that enable thermal management between two opposing broad area surfaces that is passively operated to adjust heat conduction in either direction as triggered by pre-set environmental temperature rather than mechanical or electrical stimuli. This thermal management system has the capability of cooling or heating modes within a single architecture, and is primarily designed to function in a passive manner. The system can also be designed to operate in conjunction with, or augmented by, active systems. By utilizing two-way shape memory materials that change shape at a particular temperature to create a conductive bridge between thermally conductive walls, the passive thermal management system provides a means for the transfer of thermal energy across an insulating layer. Upon cooling below a particular temperature, the shape memory material devices return to their original shape, breaking contact between the walls of the opposing surface, thereby returning the system back to a non-conductive state. Similarly, a one-way shape memory material with a means of restoring the system can also perform complementary thermal management functions. The shape memory materials, with either two-way or one-way shape memory effects, are employed in broad area architectures that are tailored to provide thermal management in energetic systems.

For one example, the present invention addresses an issue that is especially challenging when dealing with cryogenic systems: providing on-demand heat transfer when critical temperatures are reached. However, the present invention could also be applied in other commercial applications, such as power plants. In addition, space exploration applications that are envisioned include, but are not limited to, cryogenic tank walls and habitat walls where the unique feature of the automatic two-way movement between insulative and conductive equilibrates the temperature between the inside enclosed environment and the outside surroundings. Materials of construction include metals, composites, plastics, ceramics, coatings, etc. Non-conductive (i.e., insulative) materials used for other substrates can be combined with inner conductive layers to allow for thermal contact and the transfer of heat in both the transverse and lateral directions.

The control of heat energy in the lateral direction, in combination with substrate layers of insulative materials, further enables the thermal conduction throughout broad planar areas and results in the desired heat transfer to adjacent spaces. The heat transfer to the adjacent areas can conduct by contact with physical articles; by radiation, gas conduction, or convection into empty spaces or sealed cavities; or by any combination of these modes of thermal communication. Composite materials include woven and non-woven textile fibers. This technology has the potential to be applied to any system that would have the need for a self-regulating thermal management system that allows for heat transfer from one side to another. Other applications include high-energy systems, air and space transportation, and building construction materials. Examples further include: cryogen thermal management in next generation medical imaging equipment, aircraft structural-thermal members, and commercial building envelopes for energy efficiency and environmental control.

In the following detailed description of exemplary embodiments of the disclosure, specific exemplary embodiments in which the disclosure may be practiced are described in sufficient detail to enable those skilled in the art to practice the disclosed embodiments. For example, specific details such as specific method orders, structures, elements, and connections have been presented herein. However, it is to be understood that the specific details presented need not be utilized to practice embodiments of the present disclosure. It is also to be understood that other embodiments may be utilized and that architectural, mechanical, electrical and other changes may be made without departing from general scope of the disclosure. The following detailed description is, therefore, not to be taken in a limiting sense, and the scope of the present disclosure is defined by the appended claims and equivalents thereof.

References within the specification to "one embodiment," "an embodiment," "embodiments," or "one or more embodiments" are intended to indicate that a particular feature, structure, or characteristic described in connection with the embodiment is included in at least one embodiment of the present disclosure. The appearance of such phrases in various places within the specification are not necessarily all referring to the same embodiment, nor are separate or alternative embodiments mutually exclusive of other embodiments. Further, various features are described which may be exhibited by some embodiments and not by others. Similarly, various requirements are described which may be requirements for some embodiments but not other embodiments.

Figure 1:
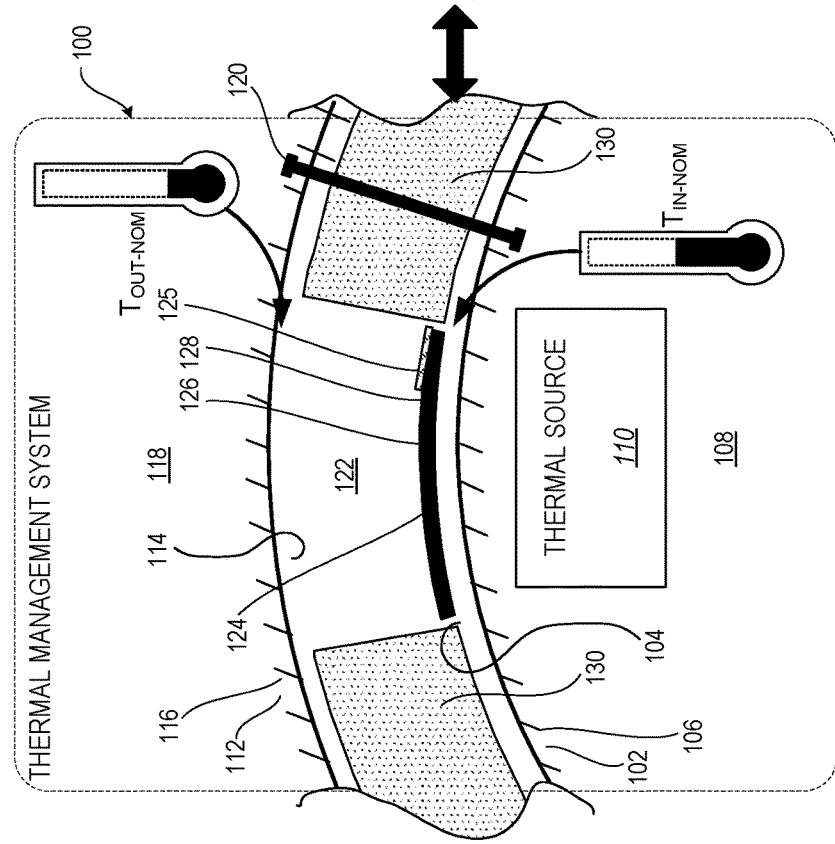
FIG. 1 illustrates a diagram of a thermal management system having a passive-acting element in a thermally-isolated shape, according to one embodiment.

FIGS. 1-2 illustrate a thermal management system 100 that is capable of changing functionality, from insulating to conductive, within a single architecture, depending on environmental conditions or applied stimuli, by incorporating shape memory materials into the system. Shape memory materials are a group of materials that can be formed into a particular shape in the parent phase, and then plastically deformed at a relative lower temperature, inducing a phase change. Upon subsequent exposure to a higher temperature, the material reverts to its parent phase and recovers its original shape. Materials that exhibit this property are referred to as one-way shape memory materials. Some materials also undergo a shape change upon re-cooling and are referred to as two-way shape memory materials. In one or more embodiments, the thermal management system 100 employs shape memory materials to provide a passively changeable system between insulative and conductive states with no additional electrical or mechanical moving parts.

For example, the use of such a two-way shape memory material allows the system to transform when the temperature is raised or lowered in the range of (minus 250° C. to 180° C.). For shape memory materials formed from an SMA, small changes in the composition ratios of the alloy can have a significant effect on the transformation temperature. The transformation temperature is controlled by small changes in alloy composition.

Generally, an alloy undergoes a transformation from the austenite phase to the martensitic upon strain below the transformation temperature, which is then reversed upon heating, returning to the parent phase. A wide range of materials exhibit the shape memory property, but only those that exhibit substantial amounts of strain recovery force upon changing shape are available commercially. Table 1 below lists a number of metallic alloys that have been investigated. Small changes in the composition ratios can have a significant effect on the transformation temperature. The transformation also exhibits hysteresis in that the transformation on heating and cooling do not overlap.

TABLE 1

| Alloy | Composition* | Transformation temperature [° C.] | Transformation hysteresis [° C.] |
|---|---|---|---|
| Ag—Cd | 44/49 at. % Cd | −190 to −50 | 15 |
| Au—Cd | 46.5/50 at. % Cd | 30 to 100 | 15 |
| Cu—Al—Ni | 14/14.5 wt. % Al, 3/4.5 wt. % Ni | −140 to 100 | 35 |
| Cu—Sn | ~15 at. % Sn | −120 to 30 | 10 |
| Cu—Zn | 38.5/41.5 wt. % Zn | −180 to −10 | 10 |
| Cu—Zn—X (X=Si, Sn, Al) | ~wt. % X | −180 to 200 | 10 |
| In—Ti | 18/23 at. % Ti | 60 to 100 | 4 |
| Ni—Al | 36/38 at. % Al | −180 to 100 | 10 |
| Ni—Ti | 49/51 at. % Ni | −50 to 110 | 30 |
| Fe—Pt | ~25 at. % Pt | ~130 | 4 |
| Mn—Cu | 5/35 at. % Cu | −250 to 180 | 25 |
| Fe—Mn—Si | 32 wt. % Mn/ 6 wt. %Si | −200 to 150 | 100 |

*at. % = atomic percent, wt. % = percent by weight

The transformation temperature of shape memory material, such as SMAs, depends upon the alloying composition. Just a few percent difference in one of the alloying components can have a significant effect on the transformation temperature. Current existing SMAs with transformation temperature ranges of about −200° C. to 250° C. can therefore be utilized, all depending upon their custom composition. However, the transformation hysteresis can be quite large too at the more extreme temperatures. Depending upon the application, it may be necessary to have a custom specification SMA made and fabricated allowing for controllable and unique transformation properties for a variety of environments.

Although a number of the alloys listed in Table 1 have transformation temperatures in the cryogenic region, the only two alloys that have achieved any level of commercial exploitation are the NiTi alloys and the copper-base alloys, particularly CuAlNi and CuZnAl. For the purposes of thermal management, the Cu-based alloys have the higher thermal conductivity (30-120 W/mK) compared to NiTi (8.6-18 W/mK). Also the Cu-based alloys can be trained to exhibit the two-way shape memory effect, which would make them ideal for a proof-of-concept application. It should be appreciated that the aforementioned shape memory materials are exemplary and that others may be used in a thermal management system according to the present invention.

In one embodiment of FIGS. 1-2, the thermal management system 100 includes a first substrate 102 of thermally-conductive material that has a first inner surface 104 and a first outer surface 106. For example, the thermally-conductive material can be copper or silver. The first substrate 102 is subject to thermal heating from an inside space 108, such as from a thermal source 110 within the inside space 108. The inside space 108 includes an empty space, a sealed cavity, or a physical object. A second substrate 112 of thermally-conductive material has a second inner surface 114 and a second outer surface 116 that is exposed to an outside space 118. The outside space 118 includes an empty space, a sealed cavity, or a physical object. A connecting structure 120 is attached to the first and second substrates 102, 112 to space apart the first and second inner surfaces 104, 114 defining an insulating space 122.

In one embodiment, the first substrate 102 can be metallic. In a particular embodiment, the second substrate 112 can be non-metallic. For example, the second inner surface 114 can be thermally conductive.

In one embodiment, the first substrate 102 can be non-metallic and the first inner surface 104 is thermally conductive. In a particular embodiment, the first substrate 102 can be ceramic. Alternatively, the first substrate 102 can be a composite material. Further, the second substrate 112 can be non-metallic and the second inner surface 114 can be thermally conductive. For example, the second substrate 112 can be ceramic. Alternatively, the second substrate 112 can be a composite material.

With particular reference to FIG. 1, a passive-acting element 124 is attached to the inner surface 104 of the first substrate 102 that is at a nominal inside temperature range ($T_{IN\text{-}NOM}$). The second substrate 112 is at nominal outside temperature ($T_{OUT\text{-}NOM}$). The passive-acting element 124 is in a thermally-isolating shape 126. With particular reference to FIG. 2, the passive-acting element 124 comprises an SMA that is trained at a transformation temperature that is elevated from the nominal inside temperature range ($T_{IN\text{-}NOM}$) to actuate to a thermally-conducting shape 126' that contacts the second inner surface 114 of the second substrate 112. For example, the transformation temperature can be less than an elevated inside temperature ($T_{IN\text{-}ELE}$). Due to an increase in thermal transfer through the passive-acting element 124, the second substrate 112 increases in temperature to an elevated outside temperature ($T_{OUT\text{-}ELE}$) and the first substrate 102 begins to decrease in temperature. The thermal management system 100 can include a biasing component 128 either incorporated into the passive-acting element 124 as a two-way SMA or the biasing component 128 can be a separate component. The biasing component 128 at a nominal temperature range restores the SMA to the thermally-isolating shape 126 that does not contact the second inner surface 114 of the second substrate 112 as the passive-acting element 124 transitions below the transformation temperature.

In one embodiment, the biasing component 128 may be a spring member. As another alternative, the biasing component 128 can be a superelastic SMA as a separate component that is trained to restore the passive-acting element 124 during a thermal transition below the transformation temperature. The biasing component 128 or a flexible non-SMA member attached to an apex portion of the passive-acting element 124 can actuate with the passive-acting element 124 to provide an additional thermal transfer path. Similarly a thermally conductive plate member 125 attached on top of the passive-acting element 124 can increase thermal contact area with the second inner surface 114 of the second substrate 112.

In one embodiment, the thermal management system 100 includes an insulating material 130 in the insulating space 122. Alternatively or in addition, the insulating space 122 can have reduced convective heat loss by being in a state of low atmospheric pressure or a vacuum.

In one embodiment, the second substrate 112 may be substantially made of ceramic or composite material that has an inherent insulative property. A thermally conductive pathway may be provided that includes a metallic contact pad of the second inner surface 114 aligned to contact the passive-acting element 124 and to conduct the received thermal energy through the second substrate 112 to the second outer surface 116 to be transferred by conduction, radiation, gas conduction, or convection. While the heat is conducted primarily through the conductive element 114, the insulative element 112 enables the control of heat transfer in the lateral direction for thermal management across broad planar areas. This heat spreading function is important for systems that are subject to non-uniformity in temperatures among different regions of the system. A similar arrangement may be made for conducting thermal energy through a first substrate 102 that is substantially made of ceramic or composite material that is inherently insulative.

It should be appreciated with the benefit of the present disclosure that an inside space 108 and outside space 118 are illustrated for clarity, although the orientation could be reversed. Alternatively, the thermal management system 100 may be in contact on either or both of the first and second substrates 102, 112 to other structures. Further, the curved shape of the thermal management system 100 is exemplary. Other embodiments can be parallel plates, for example. Other embodiments can include substrates that are unevenly spaced with passively-activated elements sized for the local spacing.

In one or more embodiments, the thermal management system 100 may be alternatively in a thermally-conducting shape when in a nominal temperature range. A passive-acting element may separate from the second substrate in response to an elevated temperature to protect the second substrate from overheating.

Figure 3:
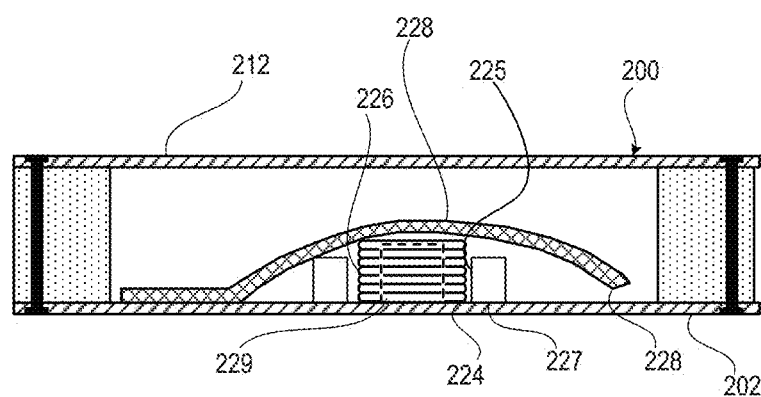
FIG. 3 illustrates a diagram of a thermal management system having a biasing bow spring component that has restored a shape memory coil spring to a thermally-isolated shape, according to one embodiment.
Figure 4:
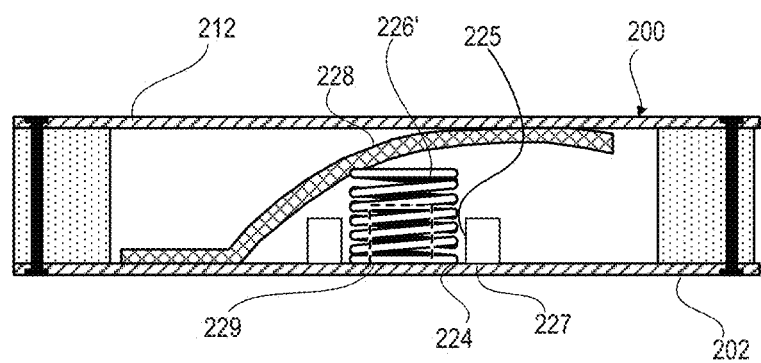
FIG. 4 illustrates a diagram of the thermal management system of FIG. 3 having the biasing bow spring component that has been overcome by the shape memory material coil spring transforming to a thermally-conducting shape, according to one embodiment.

In FIGS. 3-4 illustrates a thermal management system 200 having parallel substrates 202 and 212 of thermally-conductive material. As proof of the present invention, a nitinol (NiTi) SMA compression spring passive-acting element 224 was in a thermally-isolated shape at ambient temperature, appearing as a tension spring in its relaxed state. Upon heating above the transformative temperature, the NiTi SMA compression spring passive-acting element 224 expanded approximately 50% of its length with a force of 4N to a thermally-conducting shape 226'. It should be appreciated that the passive-acting element 224 is thermally isolating or thermally conducting based upon a state of being separated from or contacting respectively the second substrate 212. The material property of thermal conductivity of the passive-acting element 224 is not transformed. The NiTi compression spring passive-acting element 224 has a known actuation temperature of 55°-65° C. The expandable NiTi compression spring passive-acting element 224 is placed underneath a copper-beryllium (CuBe) bow spring biasing component 228 with sufficient spring constant that it returns the NiTi compression spring passive-acting element 224 to its original thermally-isolating shape 226 upon cooling. In effect the NiTi compression spring passive-acting element 224 functions to expand or contract in a manner of a two-way shape memory material to passively transition between conducting and insulating. The NiTi compression spring passive-acting element 224 can be laterally guided by being within a bore 225 of a Cu spring guide 227 or encompassing a Cu guide pin 229.

Figure 5:
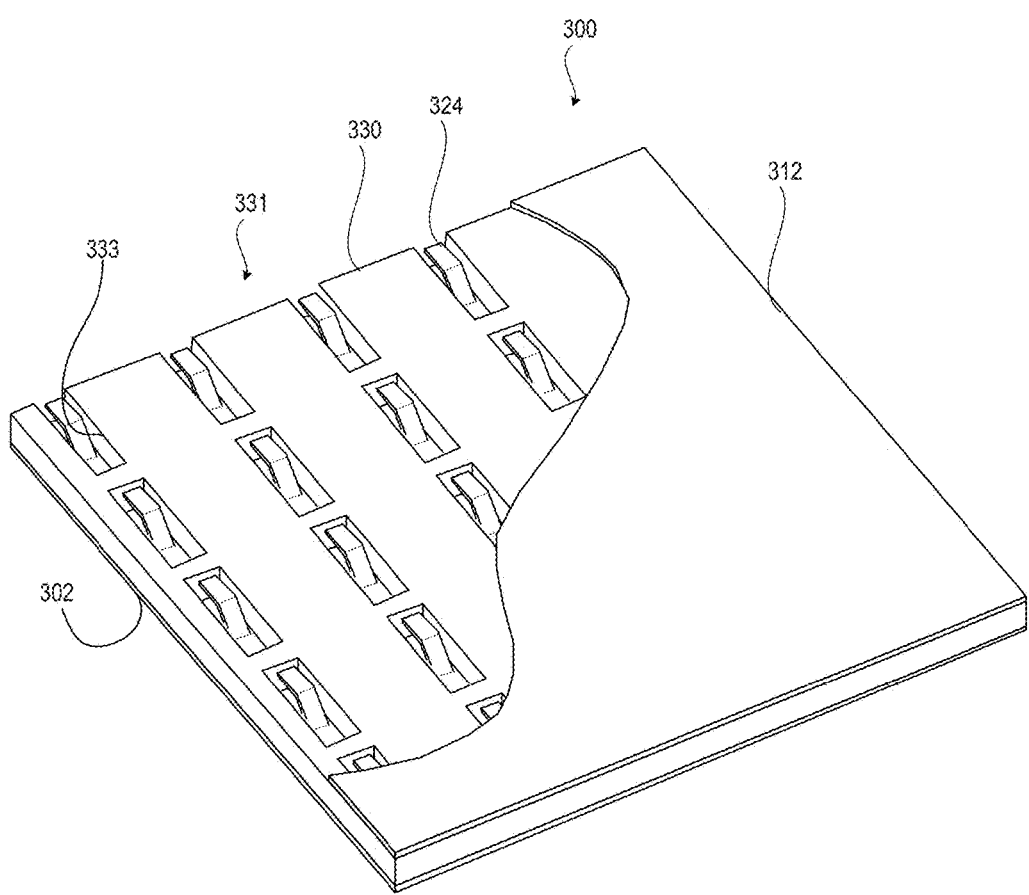
FIG. 5 illustrates an isometric view of a thermal management system having an upper substrate partially cutaway to expose two-way shape memory material finger passive-acting elements, according to one embodiment.
Figure 6:
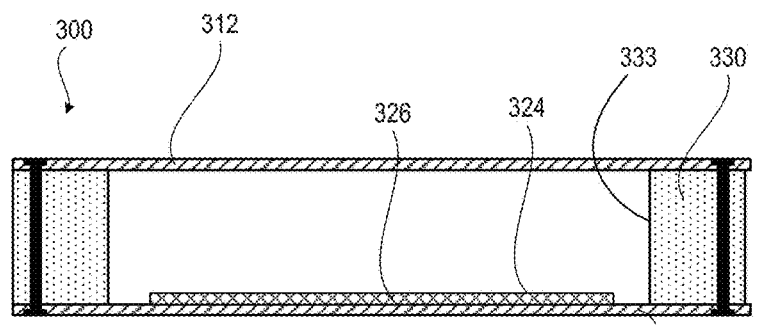
FIG. 6 illustrates a side view of a two-way shape memory material finger passive-acting element of FIG. 5 in a thermally-isolated shape, according to one embodiment.
Figure 7:
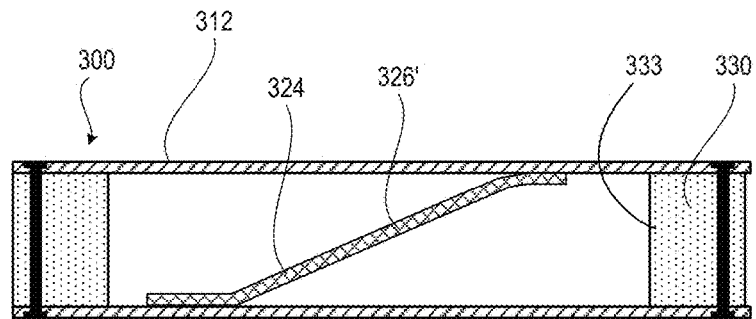
FIG. 7 illustrates a side view of the two-way shape memory material finger passive-acting element of FIG. 6 in a thermally-conducting shape, according to one embodiment.

FIGS. 5-7 illustrate a thermal management system 300 that uses two-way shape memory finger passive-acting elements 324. With particular reference to FIG. 5, a finger pattern 331 of two-way shape memory passive-acting elements 324 allows for even thermal contact over an upper substrate 312, such as a metal plate. Thermal transfer is achieved across an insulated interface of insulative layer 330 by the two-way shape memory finger passive-acting elements 324 to provide a means for heat to be transferred across a standard insulating layer between two walls (lower and upper substrates 302, 312) if the temperature on one side reaches a critical level. Upon heating of the bottom surface of the lower substrate 302, when the predefined transformation temperature of the two-way SMA finger passive-acting element 324 is reached, the two-way SMA finger passive-acting elements 324 actuate to thermally isolating shape 326' and rise through pre-cut holes 333 formed in the insulative layer 330 to contact the upper substrate 312 (FIGS. 5 and 7), providing a thermally conducting path allowing heat transfer away from the lower substrate 302. In this embodiment, a two-way SMA can be utilized to conduct heat away from the lower substrate 302 allowing it to cool. Upon passing back through the transformation temperature, the shape memory finger passive-acting elements 324 would again actuate causing them to revert to their original thermally isolating shape 326 (FIG. 6), breaking the contact with the upper substrate 312 and returning the thermal management system 300 to the insulative state.

Figure 8:
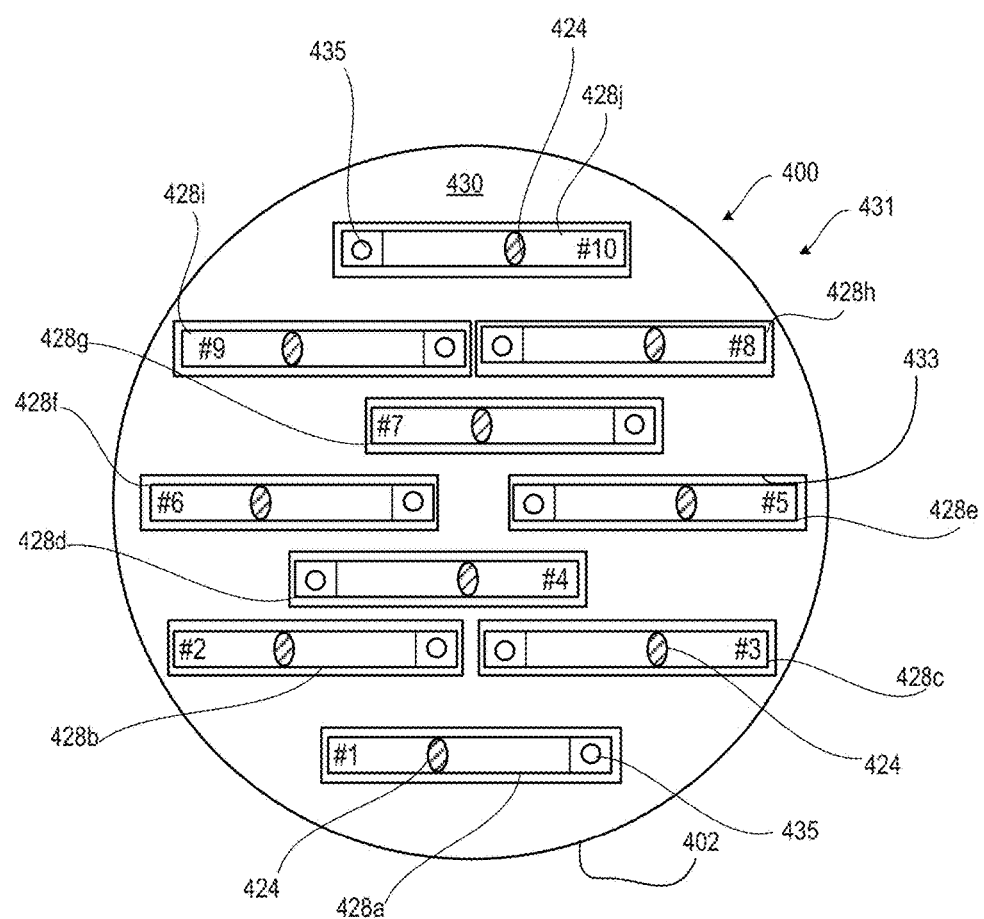
FIG. 8 illustrates a top view of a circular thermal management system incorporating the biasing bow spring component and shape memory material coil spring of FIGS. 3-4, according to one embodiment.

FIG. 8 illustrates a thermal management system 400 having a lower substrates 402 formed from 8-inch circular plates of 1/16 inch Cu or stainless steel. For clarity an upper substrate is omitted. A finger pattern 431 of holes 433 are cut out of insulative layer 430. A number of #1-#10 CuBe bow spring biasing components 428a-428j were distributed into respective holes 433 with a respective lower end 435 attached to the lower substrate 402 and having a midportion contacted from below by a corresponding NiTi spring passive-acting elements 424, chosen to correspond to the contacting portion and positioned to provide an even distribution.

Thermocouples were placed on the top surface of both the bottom and top plates near the center of each plate. The resistance between the top and bottom plate was monitored so that the point at which contact was made and broken between the fingers and the top plate could be determined. Measurements were taken at one minute intervals until the temperature stabilized at which point the hot plate was turned off. The system was allowed to cool until contact was broken indicating the fingers had cooled sufficiently and retracted from the top plate. At this point the system was removed from the hot plate.

Figure 9:
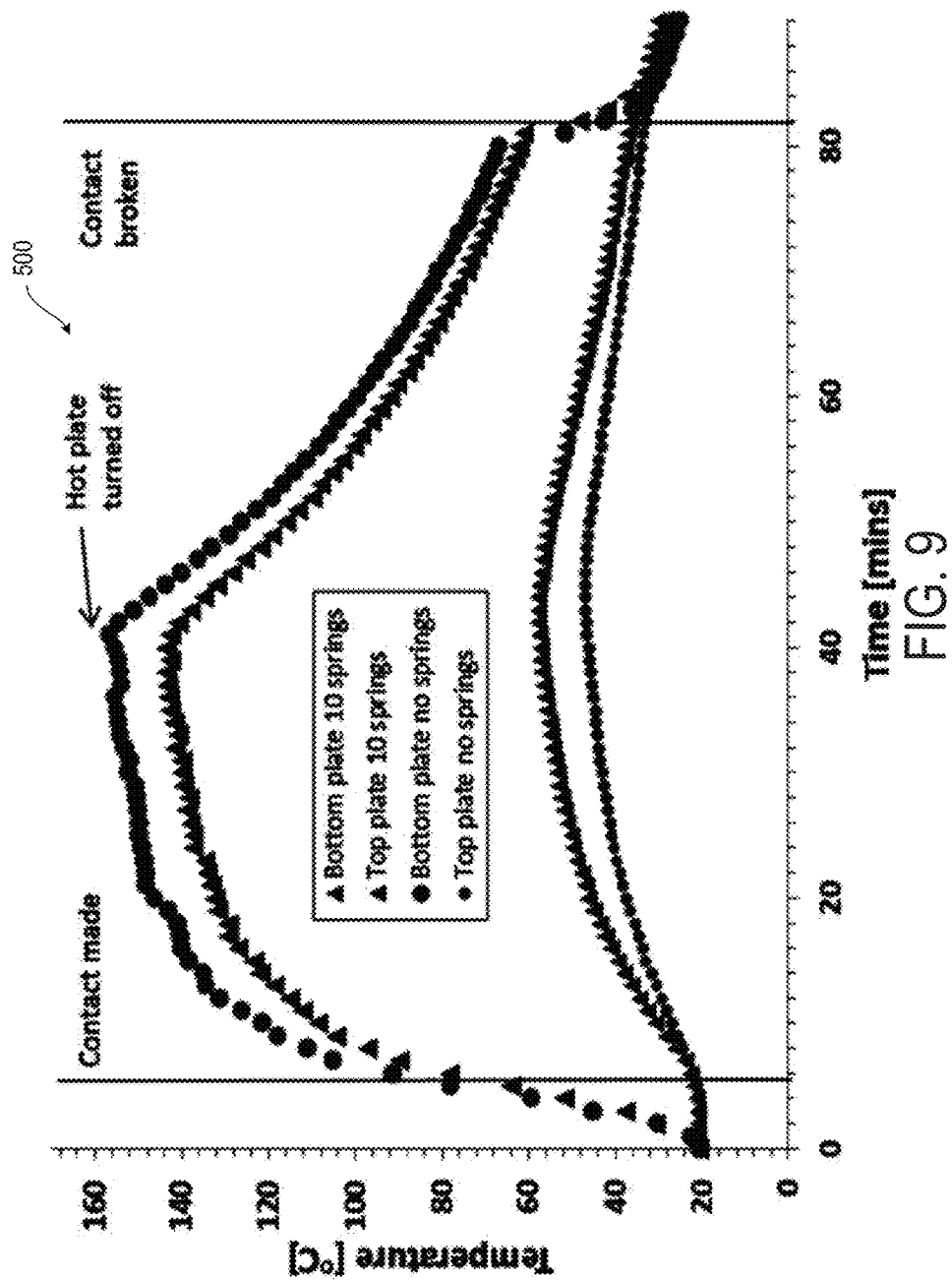
FIG. 9 illustrates a plot of test results for the circular thermal management system of FIG. 8 of the temperature of both Cu plates with and without the CuBe bow springs and Nickel-Titanium (NiTi) coil springs, according to one embodiment.

FIG. 9 illustrates a plot 500 of test results of the temperature of both Cu plates with and without the CuBe springs and NiTi coil springs. The temperature on the top of the bottom copper plate and top of the top copper plate is provided for the control system in which there were no contact springs and only insulting foam between the two 8" copper plates. The temperature for the same two points but with the 10 CuBe/NiTi springs inserted between the plates is also illustrated. The hot plate was set to 170° C. For the control system, the temperature on the top of the bottom plate that is in contact with the hot plate reached a maximum of 155° C. before stabilizing, and the temperature on the top of the top plate reached a maximum of 46° C. This showed the foam between the plates used in this experiment was not a perfect insulator. When the system was reassembled with the 10 springs added, and the experiment repeated, it was observed that once the springs actuated and made contact with the top plate (at about 90° C. on the bottom plate), the temperature on the top plate rose higher than the control, reaching a maximum temperature of 57° C. (about 11° C. higher than the control), showing heat conduction, whereas the bottom plate reached a maximum temperature of only 143° C. (about 12° C. lower than the control). The data showed that the SMA transformable system allowed heat to transfer from the bottom plate (on the heat source), once a certain temperature was reached, to the top plate, reducing the amount the bottom plate heated.

In another test, small inserts of the cryolite insulative foam were cut out to fill the air gap present under the CuBe fingers. A hole was punched in each of the inserts to accommodate the NiTi spring. Re-running the system in this configuration showed significant improvement in the heat loss distribution around the CuBe fingers compared to the old foam.

Figure 10:
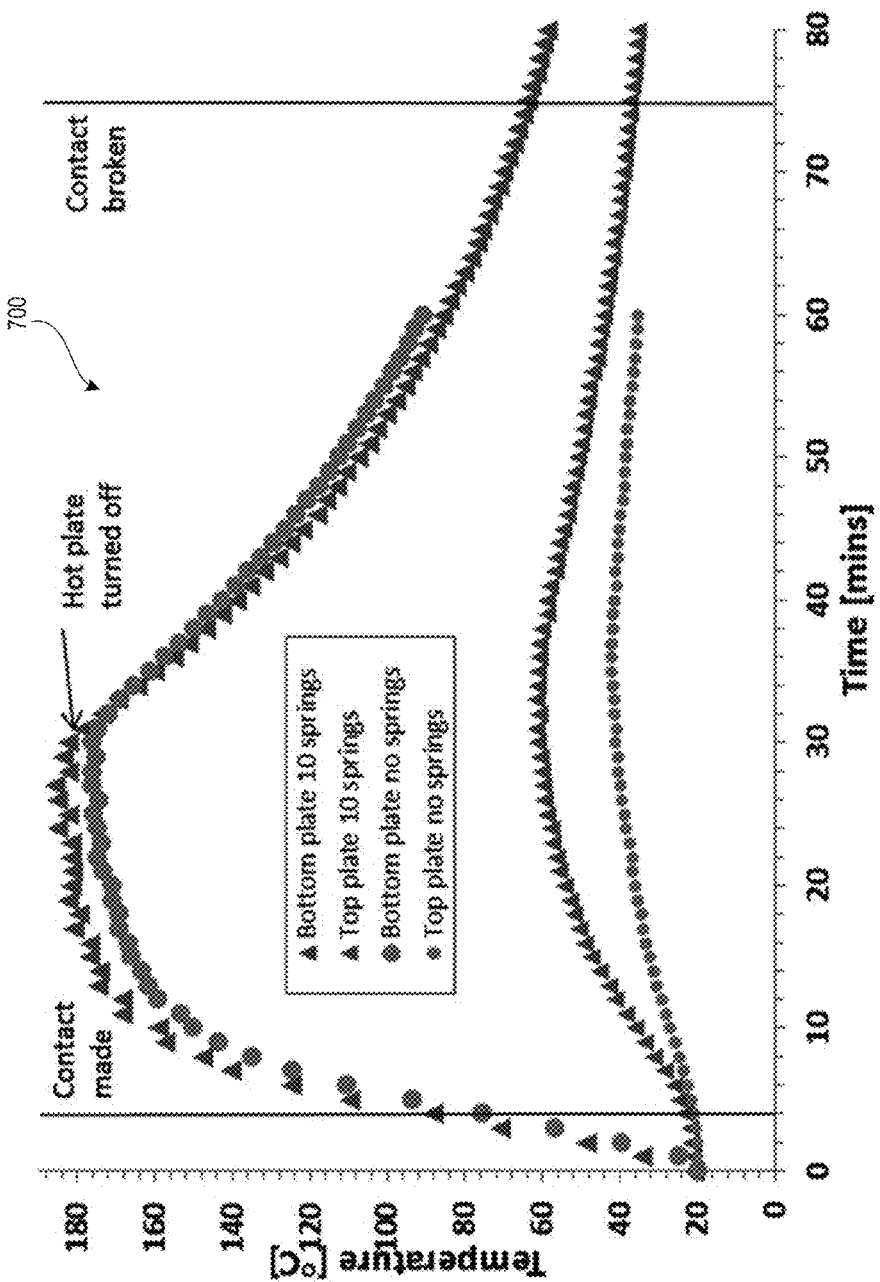
FIG. 10 illustrates a plot of the temperature of both stainless steel plates with and without the CuBe springs and NiTi coil springs for the circular thermal management system of FIG. 8, according to one embodiment.

In a further tested embodiment, eight inch plates of 314 stainless steel were cut out and the thermal management system reassembled with a solid cryolite foam layer and no spring assembly. Thermocouples were placed on the top surface of both the bottom and top plates near the center of each plate. The system was heated on the hot plate using the same parameters as for the Cu plate system. At the point the temperatures on the bottom and top plates stabilized, the hot plate was turned off and the system was allowed to cool. The system was then reassembled with the CuBe bow spring/NiTi coil spring assembly. The resistance between the top and bottom plate was monitored so that the point at which contact was made and broken between the fingers and the top plate could be determined. Measurements were taken until the temperature stabilized at which point the hot plate was turned off. The thermal management system was allowed to cool until contact was broken indicating the fingers had cooled sufficiently and retracted from the top plate. At this point the system was removed from the hot plate. FIG. 10 illustrates a plot 700 of the temperature of both stainless steel plates with and without the CuBe bow spring/NiTi coil spring assemblies.

Figure 11:
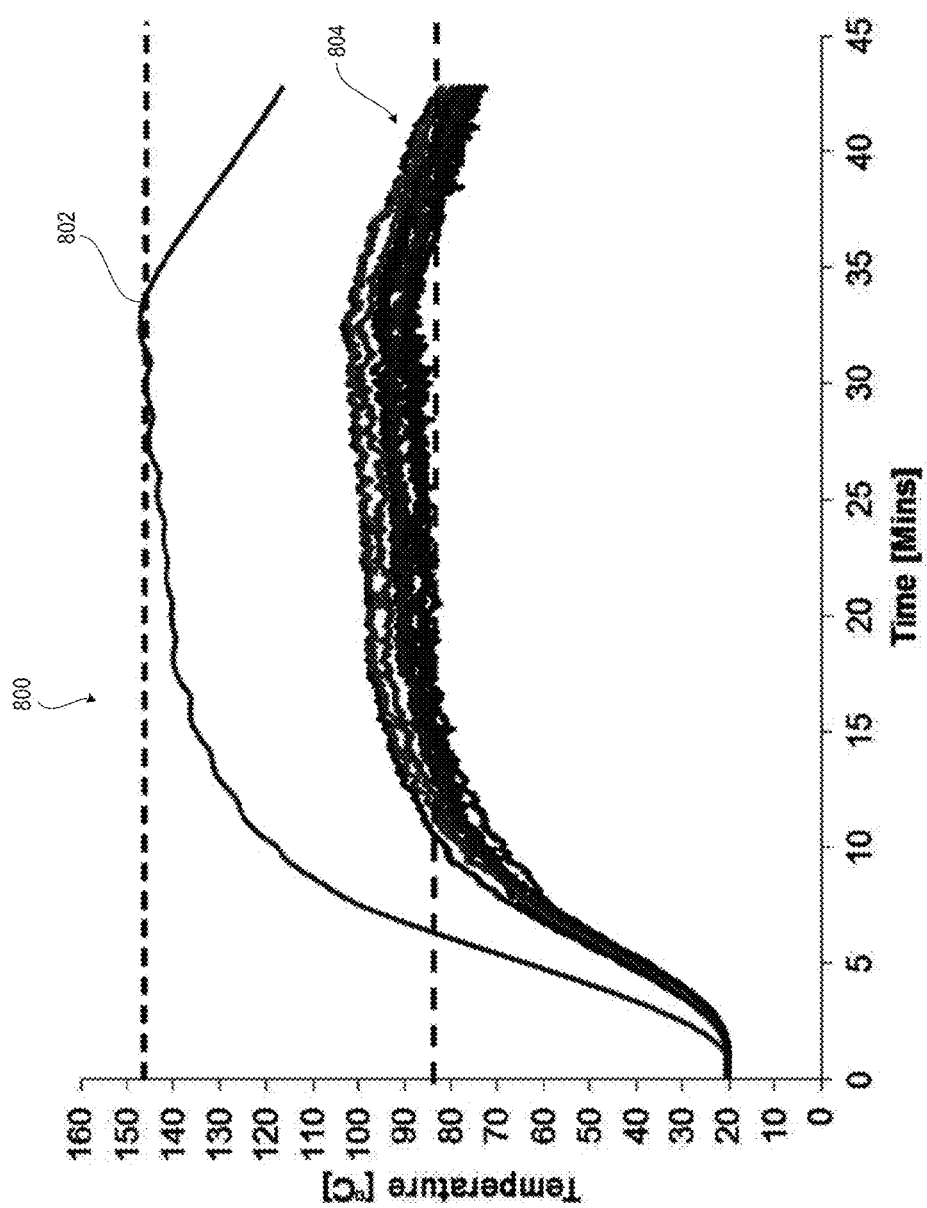
FIG. 11 illustrates a plot of data from the thermocouples with the insulating foam in place, according to one embodiment.

FIG. 11 illustrates a plot 800 of data from the thermocouples with the insulating foam in place. The single trace 802 is the temperature as measured on the top surface of the bottom Cu plate. The other traces 804 are the 10 thermocouple on top of the fingers. Here the temperature of the bottom plate reached a maximum of 146° C., however there is some spread of the data among the 10 thermocouples, but the mean was determined to be about 85° C. Several runs were performed and the data was reproducible and consistent.

In order to further test the effective response of the system for a point heat source simulating a small localized hot spot, a one inch thermally-conductive component was placed in a resistive heater controlled by a variable autotransformer. Running the variable autotransformer at 30% allowed the baseplate to reach 150° C. Upon heating passing the actuation temperature, the middle fingers 4 and 7 were clearly observed to actuate enough to contact the top plate if fitted. These fingers actuated as they were the closest to the heat source rather than the actual finger ends where they are attached to the baseplate.

Figure 12:
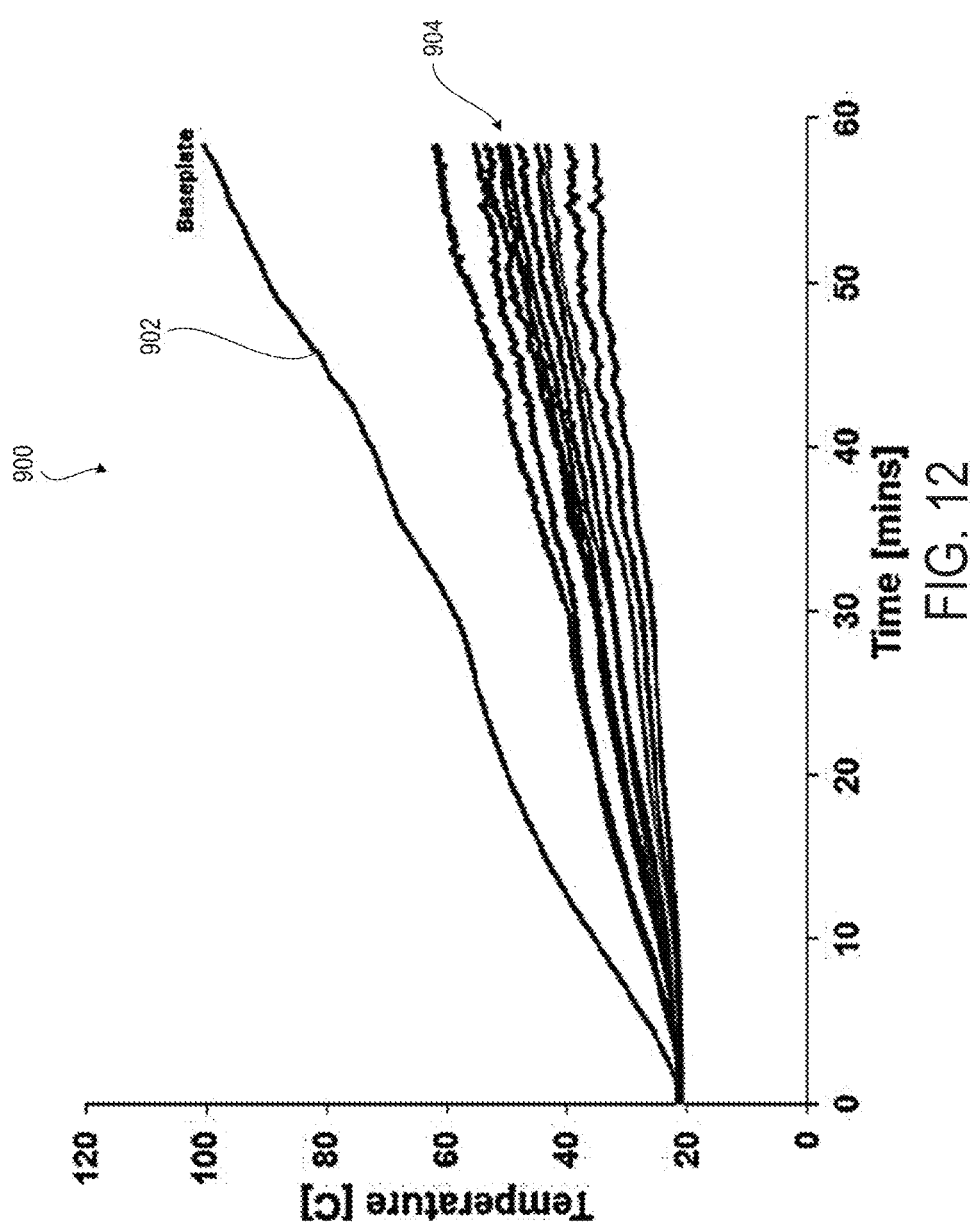
FIG. 12 illustrates a plot of the temperature traces on top of the CuBe fingers compared to the baseplate trace for the single 1-inch heat source

Another embodiment of the thermal management system was tested with the same parameters and with a thermocouple attached to the top of each finger passive-acting element to monitor the temperature of each individual finger. A thermocouple was also attached to a top surface of the baseplate. After ten training cycles, the NiTi strip showed two-way operation at cold and hot temperatures going from 4 mm to 10 mm. FIG. 12 illustrates a plot 900 of the temperature traces 904 on top of the CuBe fingers compared to the baseplate trace 902 for the single 1 inch heat source. From the temperature plot 900, fingers 10, 9, 8 and 1 had the lowest temperatures, which are also the furthest from the heat source. It was interesting to observe, that although fingers 4 and 7 (TC 4 and TC 7) actuated due to the NiTi springs being closer to the heat source, finger 6 (TC 6) actually had the higher temperature on the top. This is because finger 6 is attached to the baseplate closer to the heat source than fingers 4 and 7.

A thermal management system was constructed using available commercial off the shelf (COTS) parts formed as illustrated in FIGS. 6-7. NiTi strips of dimensions 10×40×1 mm were chosen for the actuation (Memry Corporation, Connecticut). The alloy is an approximate equiatomic NiTi composition with an austenitic start transformation temperature of approximately 65° C. The objective in this design was to utilize the 2-way shape memory effect, therefore eliminating the need for a bias spring, which increased the simplicity and reliability of the system. In order to train the SMA for 2-way movement, a series of training cycles is necessary so that the SMA "remembers" both the cold and hot shapes. The hot shape was designed such that the NiTi strip would have maximum contact with the lower and upper plates, maximizing heat transfer.

Figure 14:
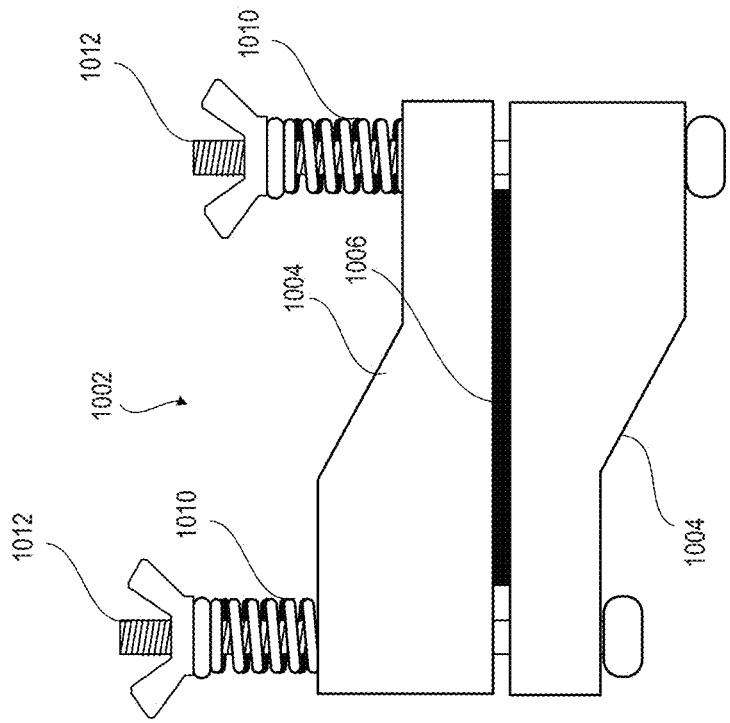
FIG. 14 illustrates a side view of a thermally-isolated shape training jig, according to one embodiment.
Figure 13:
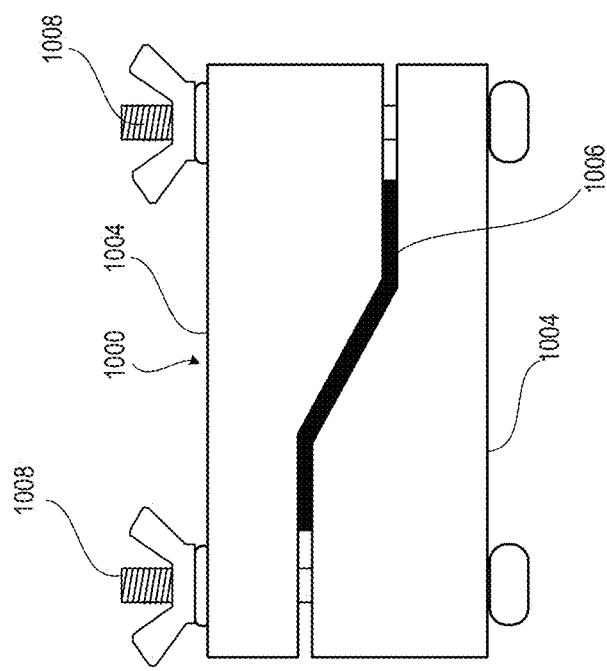
FIG. 13 illustrates a side view of a thermally-conducting shape training jig, according to one embodiment.

The NiTi strips were trained for 2-way operation by thermomechanical cycling utilizing the thermally-conducting shape training jig 1000 of FIG. 13 and the thermally-isolating shape training jig 1002 illustrated in FIG. 14. In an exemplary embodiment, both jigs 1000 and 1002 utilize identical first and second mandible pieces 1004 that can be oriented in opposition or counter position to achieve the desired shape. In the thermally-conducting shape training jig 1000 of FIG. 13, a SMA strip 1006 is deformed to its desired hot shape, held together by fasteners 1008, and annealed at 550° C. for one hour and then immediately quenched in cold water. This sets the austenite phase hot shape. The SMA strip 1006 is then placed into the thermally-isolating shape training jig 1002 illustrated in FIG. 14 where springs 1010 of fasteners 1012 apply stress onto the "hot" shaped strip, and as the alloy cools through the transformation temperature to the martensite phase, it is flattened to the desired cold shape.

As the martensite transformation temperature is below 0° C., the jig is immersed into LN2 doped aerogel and held at −196° C. for 20 minutes to set the martensitic cold phase. Several iterations of the training cycle were required to achieve a measure of 2-way movement. The objective was to achieve a minimum of 50% recovery from the austenite phase to the martensite phase to ensure a good separation from the top plate. In this case the recovery was achieved on a cold plate at about 0° C. From a fully extended austenitic phase shape with a gap of 10 mm back to the cold reverted martensite phase; thus, the gap was about was 3 mm, showing a 60-70% recovery. Further training did not show any improvement in the recovery.

Figure 15:
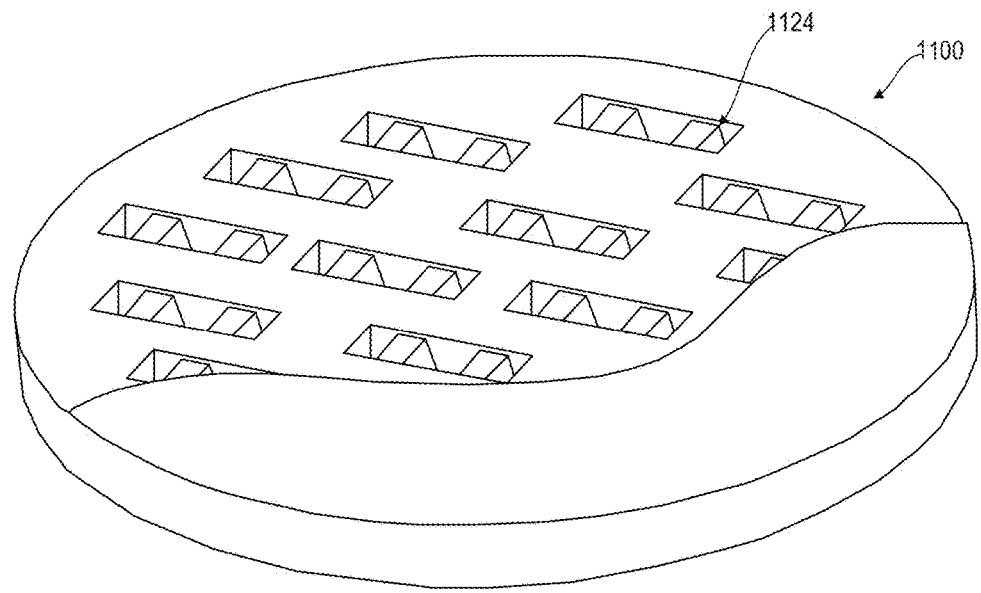
FIG. 15 illustrates a thermal management system that utilizes a flat ribbon passive-acting element, according to one embodiment.
Figure 16:
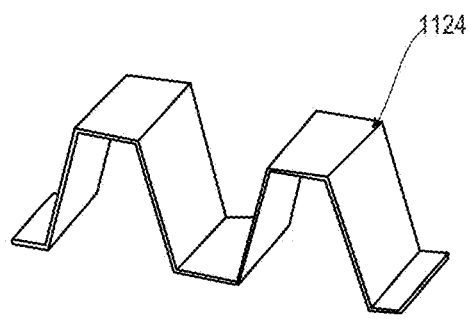
FIG. 16 illustrates an isometric view of example two-way shape memory material that is an "M" shape for the thermal management system of FIG. 15, according to one embodiment.
Figure 17:
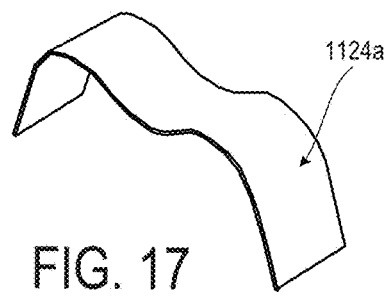
FIG. 17 illustrates an isometric view of an example two-way shape memory material that is a rounded "M" shape for the thermal management system of FIG. 15, according to one embodiment.

Initially the system in one embodiment was designed to use a two-way SMA, namely CuAlNi alloy that would allow the SMA to expand and contract and make contact between the two plates without the need for an external returning force. However, although CuAlNi SMAs are available commercially, to manufacture and train the shape required for this system was shown to be quite expensive. FIG. 15 illustrates a thermal management system 1100 that utilizes a flat ribbon passive-acting element 1124 (FIG. 16) of two-way SMA, in particular CuAlNi, that is an "M" shape. Alternatively, a two-way ribbon passive-acting element 1124a having a rounded "M" shape may be used (FIG. 17), which may lend itself to being easier to manufacture. The SMA would be initially flat, and upon operation at the transformation temperature form the "M" shape provides the contact between the two plates.

Figure 18:
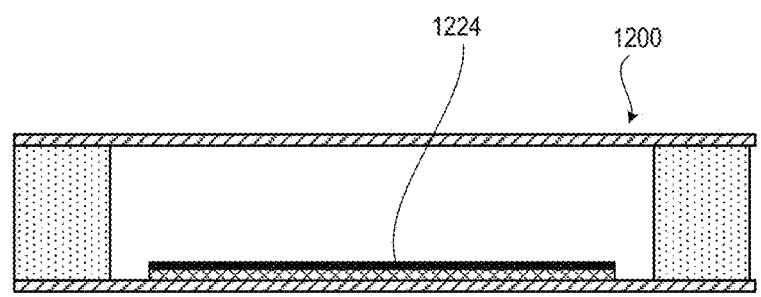
FIG. 18 illustrates a side view of a thermal management system that utilizes multiple passive-acting elements comprising bimetallic strips in a thermally-isolated shape, according to one embodiment.
Figure 19:
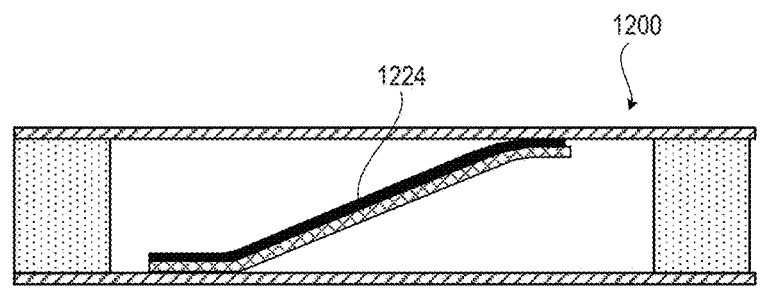
FIG. 19 illustrates a side view of the thermal management system of FIG. 18 with the bimetallic strips in a thermally-conducting shape, according to one embodiment.

FIGS. 18-19 illustrate an alternative embodiment of a thermal management system 1200 that utilizes multiple elements 1224 each comprised of a bimetallic strip of super-elastic NiTi material on top of a NiTi strip that in turn is affixed to one of two conductive metal alloy walls of an insulating layer via a fastener, the space around the bimetallic strips being otherwise filled with insulating material. The objective was that the strip would actuate at the transformation temperature and form the hot shape, producing enough force to overcome the spring constant of the super-elastic strip. When cooling, as the SMA passes back through the transformation temperature, the superelastic strip now acts as a bias spring returning the system back to its original shape with 100% recovery. The advantage of this system is that the SMA has to only be trained for 1-way movement, which is significantly more reliable and has a longer cycle life.

Figure 20:
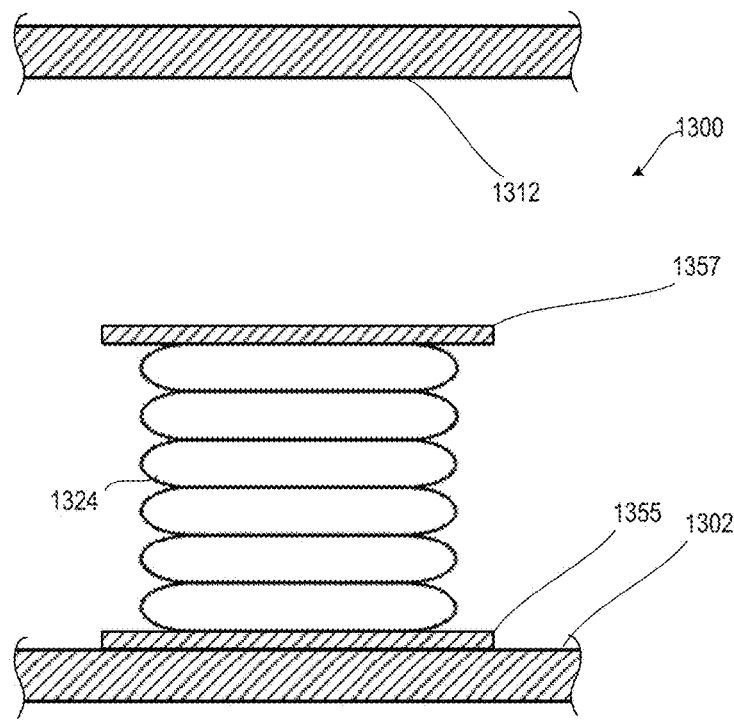
FIG. 20 illustrates a side view of a two-way actuated shape memory material coil spring passive-acting element in a thermally-isolated shape, according to one embodiment.
Figure 21:
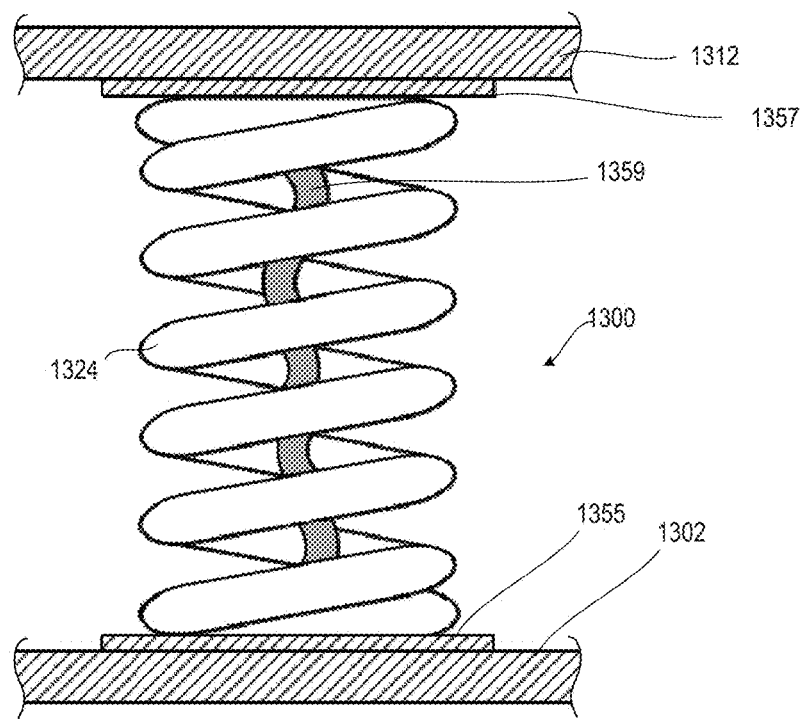
FIG. 21 illustrates a side view of the two-way actuated shape memory material coil spring in a thermally-conducting shape, according to one embodiment.

FIGS. 20-21 also illustrate an alternative embodiment of the present invention comprises multiple "two-way actuated" copper-based SMA spring passive-acting elements 1324 of a thermal management system 1300. Each spring passive-acting element 1324 is situated between two silver plates 1355, 1357 that are attached to one another by a silver rope 1359 (FIG. 21) running through the space around which the spring passive-acting element 1324 is coiled, within the standard insulating space 1322 (not shown) that is otherwise filled with insulating material. All of this is between two conductive metal alloy walls (lower and upper substrates 1302, 1312). The lower silver plate 1355 is attached to the lower substrate 1302.

Figure 22:
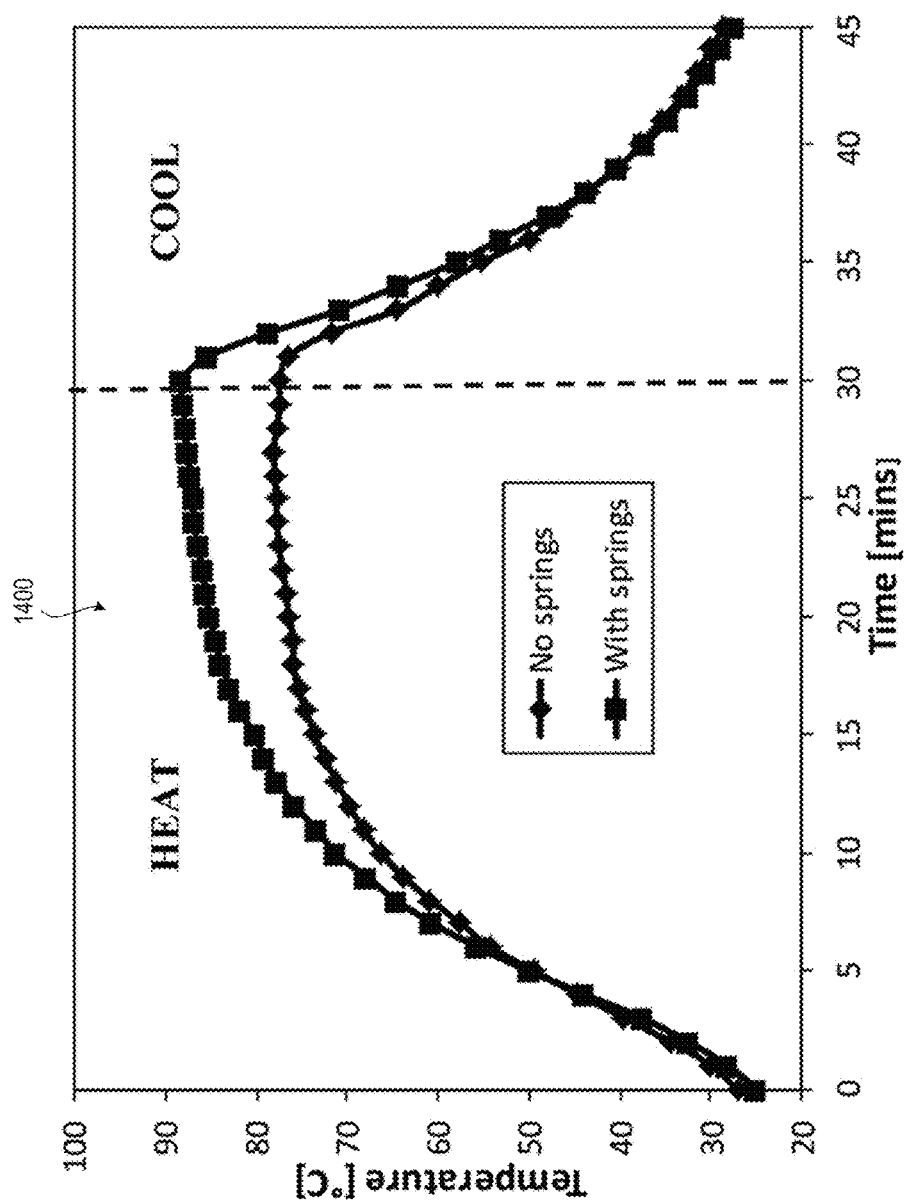
FIG. 22 illustrates a plot of the temperature of the top plate on the 3 inch system without and with the CuAlZn springs.

FIG. 22 illustrates a plot 1400 of the temperature of the top plate on the 3 inch system without and with the CuAlZn springs. A 3-inch test system was constructed composed of two 3 inch copper plates, separated ½ inch by ceramic spacers. The gap was filled with the insulation. The system was placed on a hot plate set at 150° C. and the temperature on the top plate monitored as a function of time. After 30 minutes, the top plate had reached maximum temperature and the heat added to the thermal management system was switched to a cold plate to cool down. The CuAlZn SMA springs were then included in the system in holes in the insulation, and the experiment was repeated. The no spring data illustrates the maximum temperature of the top plate reached 78.2° C. As the 3 inch system was sitting on a hot plate that was larger than the system, the rise in the top plate temperature may have had contribution from the surrounding hot air convection rather than through the insulation. The spring data illustrated a maximum top plate temperature of 88.3° C., and was still rising after 30 minutes. This corresponds to a 13% increase in the top plate temperature due to thermal conduction through the springs. The springs actuated after about 3 minutes and made contact with the top plate, as determined by measuring the resistance between the top and bottom plates. Upon cooling it is interesting to note that the spring system returned to ambient faster than the no spring system.

Figure 23:
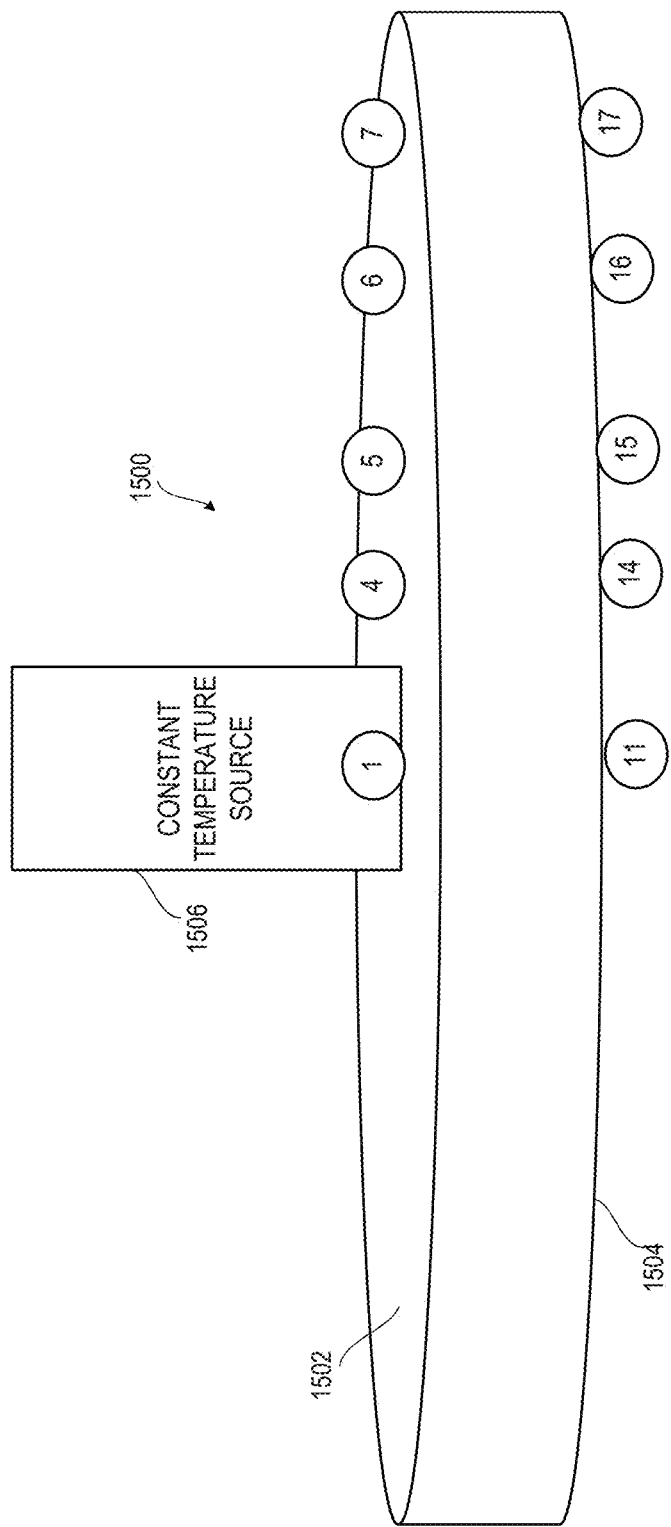
FIG. 23 illustrates a schematic of a thermal management system testing having sensor locations for transient thermal testing, according to one embodiment.

The transfer of heat energy between two opposing surfaces was tested using a custom thermal test apparatus for transient effects. These five round disk shape test articles are described as follows: 3 inch control (blank); 3 inch with 5 CuZnAl springs; 3 inch with 3 bi-strips; 8 inch control (blank); and 8 inch with 8 bi-strips. FIG. 23 illustrates a thermal management system 1500 showing the temperature sensor locations and the general arrangement of the test. The temperature of a top plate surface 1502 was measured by temperature sensors 1, 4 and 5 for the 3-inch diameter test systems and sensors 1, 4, 5, 6, and 7 for the larger 8-inch diameter test systems. Temperatures of a bottom plate surface 1504 were measured by sensors 11, 14 and 15 for the 3-inch diameter test systems and sensors 11, 14, 15, 16, and 17 for the larger 8-inch diameter test systems. Sensors 5 and 15 were the furthest ones that could collect data from the 3-inch systems. For the 8-inch, sensors 6 and 7 on the top surface, and 16 and 17 on the bottom were included. Heat was provided by a constant temperature source 1506.

Figure 24:
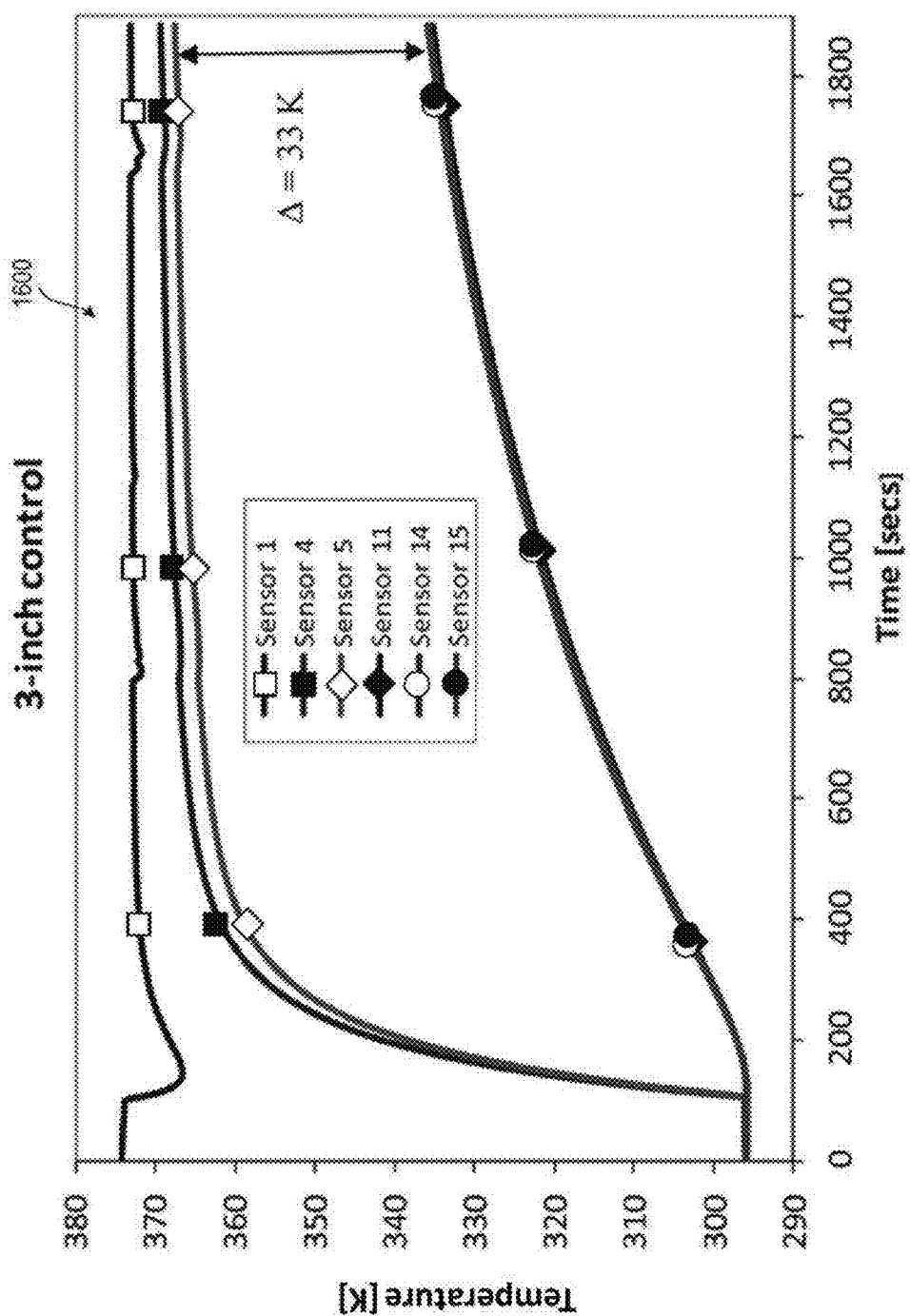
FIG. 24 illustrates a plot of the temperature of the top plate on the 3 inch system heated on the 1 inch heater probe, according to one embodiment.

FIG. 24 illustrates a plot 1600 for transient thermal data for the 3-inch control blank. For the blank system, a dip in the constant source temperature (hot temperature) is observed at about 150 seconds, but recovers as the temperature of the top plate starts to increase. Sensor 5 lag sensor 4, which is expected with the increased distance from the constant temperature source, and both sensors reach a maximum temperature of 368 K+/−1K at the end of the test. In contrast, the sensors on the bottom of the system all track similarly, reaching a maximum of 335 K+/−0.5 K. The difference between the top surface and the bottom surface of the transient thermal management system at the end of the test was 33 K+/−1 K.

Figure 25:
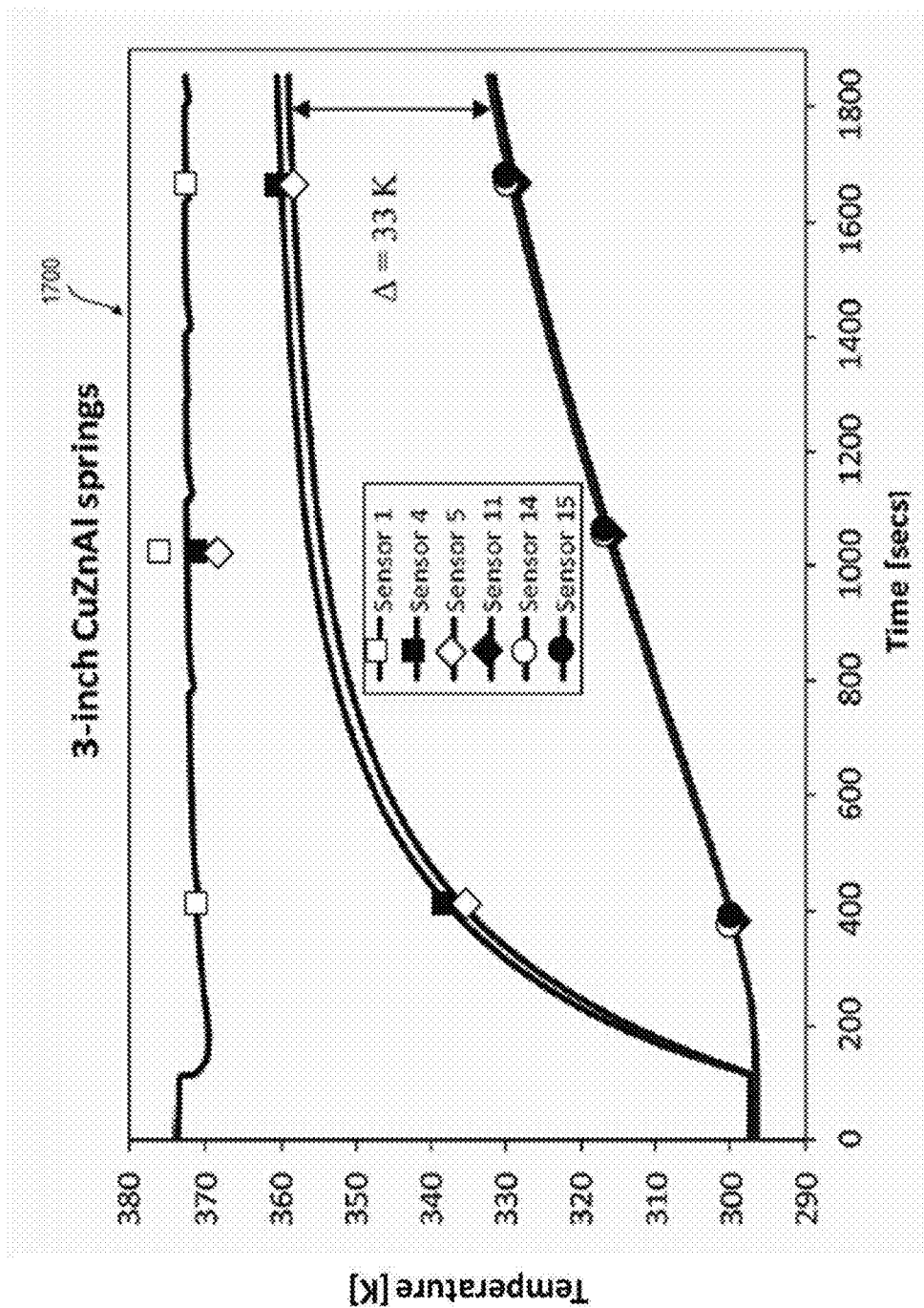
FIG. 25 illustrates a plot for the data for CuZnAl springs and bi-strip systems, according to one embodiment.

FIG. 25 illustrates a plot 1700 for the data for the 3 inch CuZnAl springs. The first thing to observe on the CuZnAl spring system was that the temperature of the constant temperature source was approximately 372 K throughout the test. The austenitic transformation temperatures of the CuZnAl springs is in the order of 368 K; however, due to the broad hysteresis, temperatures as high as 380 K are required for full movement. Therefore it is unlikely that the springs fully extended and made contact between the plates. This estimate is reflected in that the bottom plate temperature was 333 K+/−0.5 K, similar to that of the control blank. However, the temperature of the top plate away from the constant temperature source was lower for sensors 4 and 5 than the control by about 8 K. This may be due to the addition of the springs and their holders forming a larger thermal mass. The temperature difference between the surfaces of the top plate and bottom plate was 33 K+/−1 K, the same as for the control.

Figure 26:
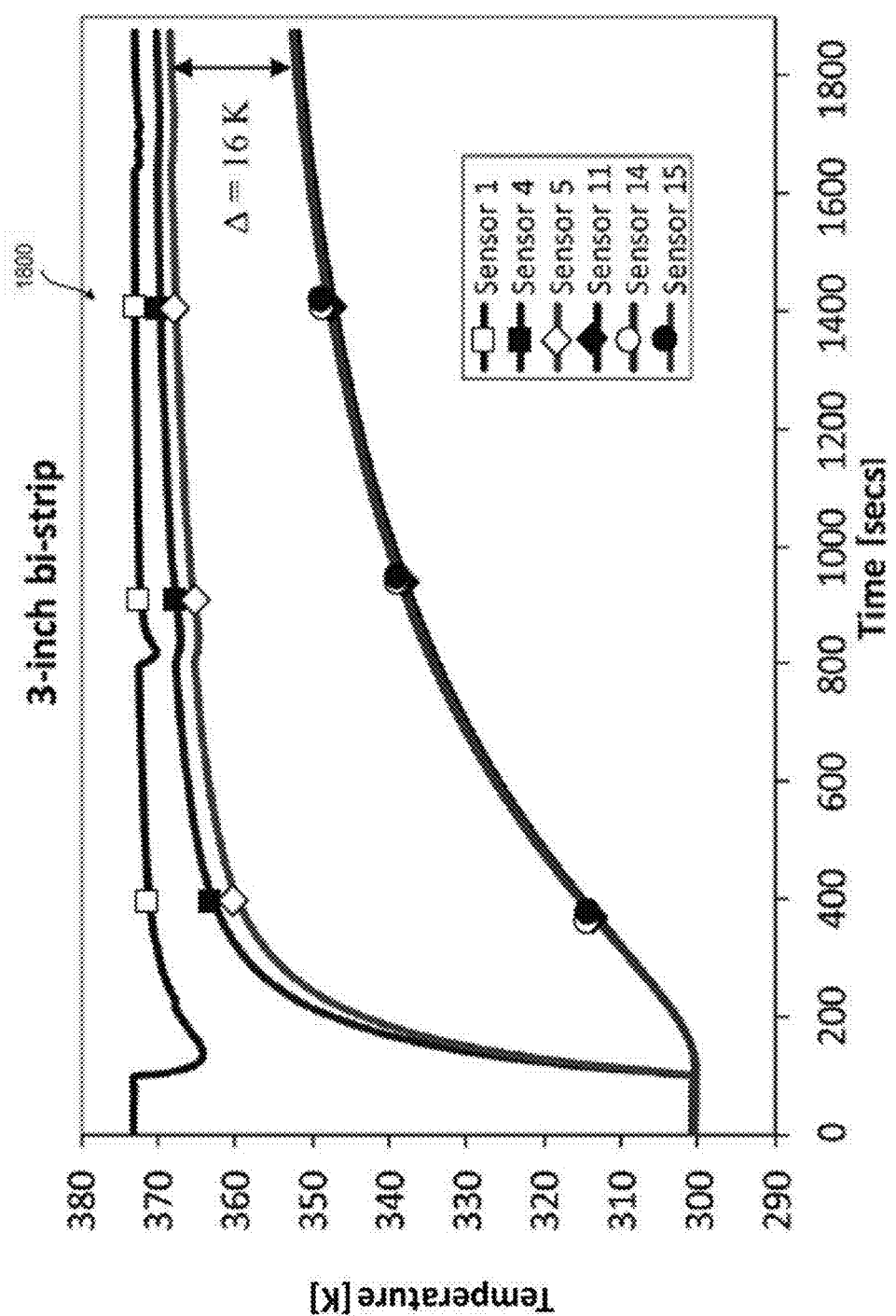
FIG. 26 illustrates a plot for transient thermal data for bi-strip system, according to one embodiment.

FIG. 26 illustrates a plot 1800 for transient thermal data for the 3-inch bi-strip system.

Figure 27:
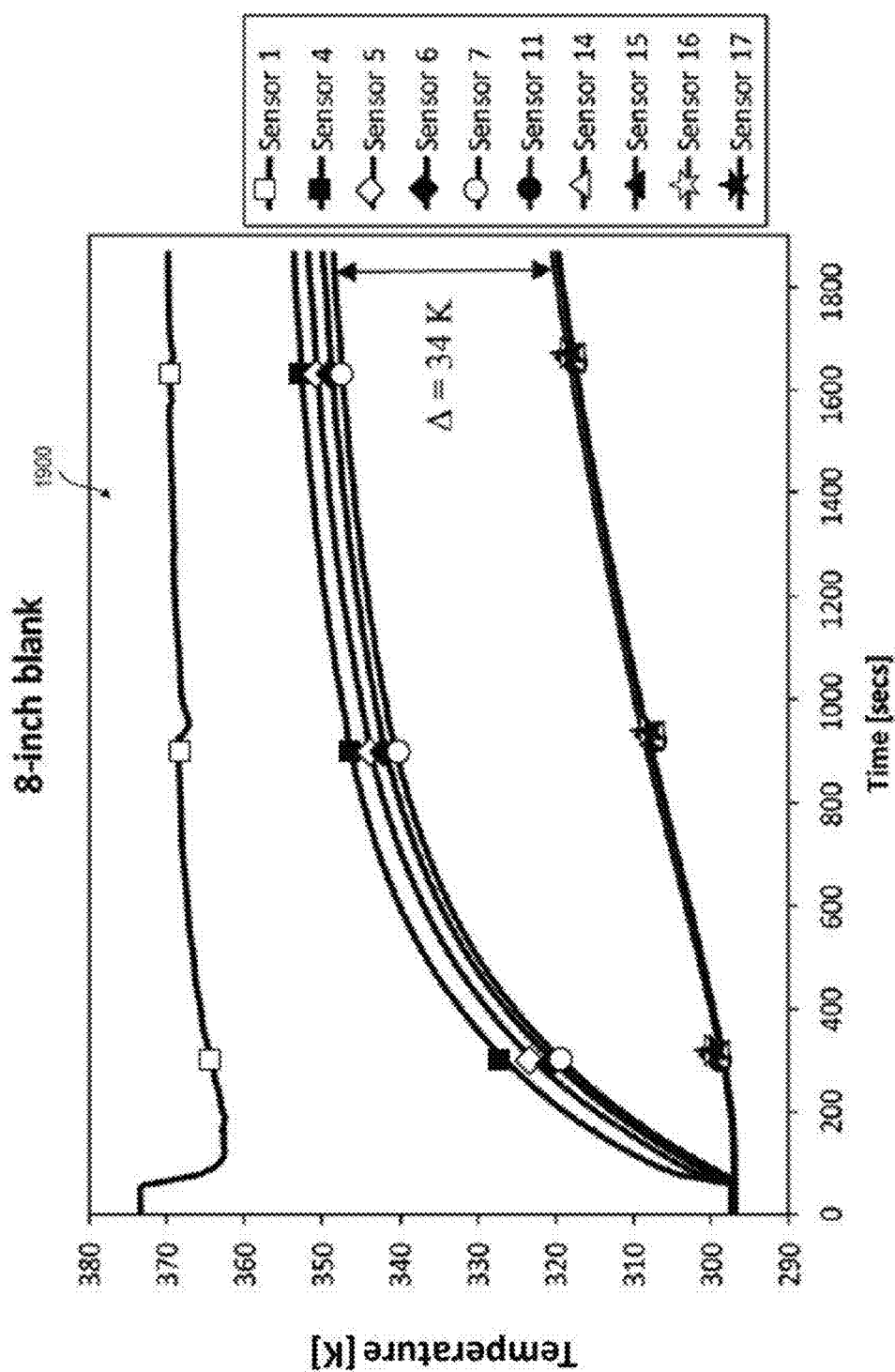
FIG. 27 illustrates a plot for an 8-inch blank system, according to one embodiment.
Figure 28:
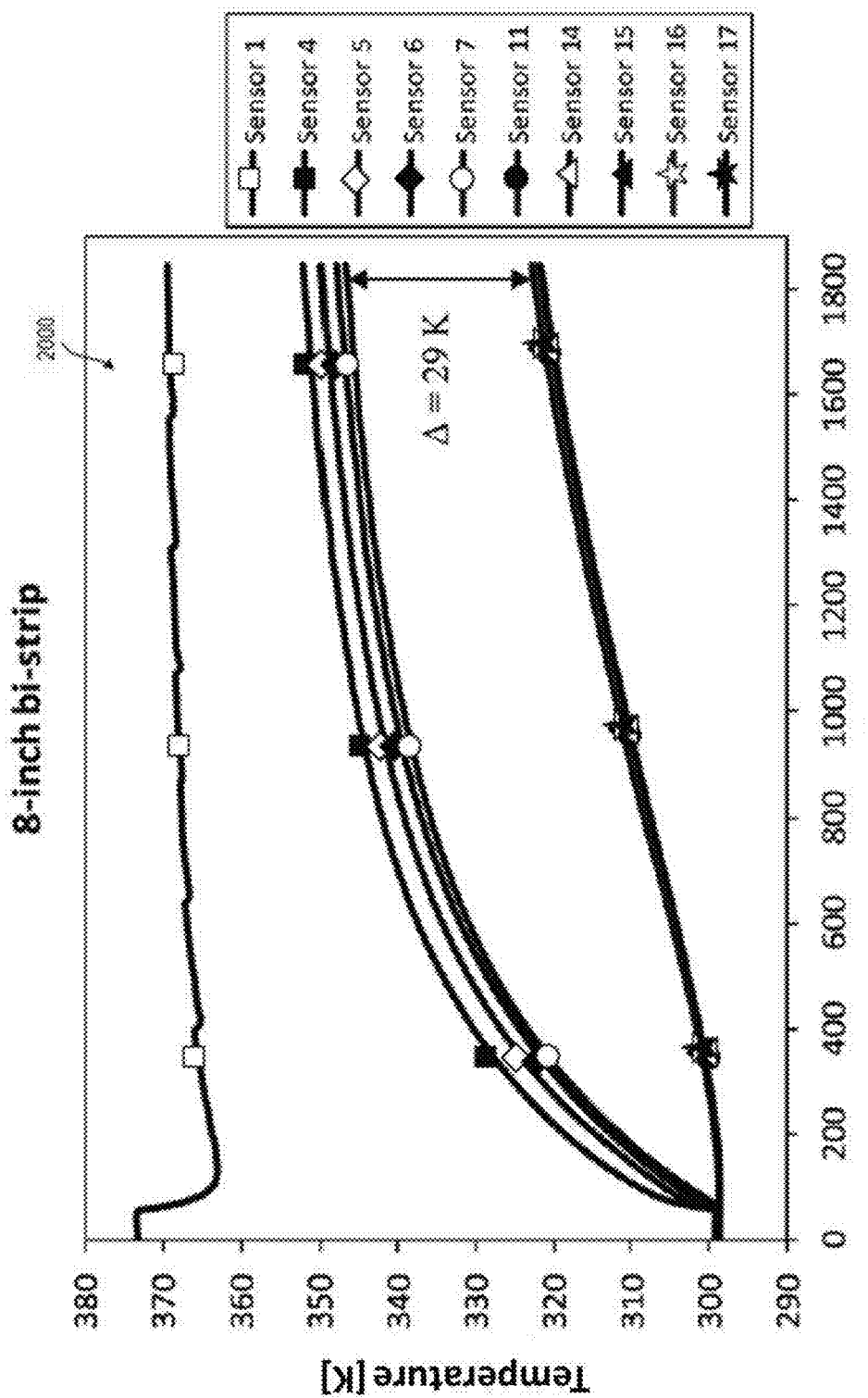
FIG. 28 illustrates a plot for transient thermal data for an 8-inch bi-strip system, according to one embodiment.

FIG. 27 illustrates a plot 1900 for the 8-inch blank system. FIG. 28 illustrates a plot 2000 for transient thermal data for the 8-inch bi-strip system. For both systems there is a distinct drop off in temperature from sensors 4 to 7, on the order of about 5-6 K, again as expected as the distance gets farther from the constant temperature source. Similarly for both systems on the bottom sensors, although it does not show on the plots as the drop is within 1 K. The bi-strip system does show a higher bottom plate temperature overall compared to the control blank, 323 K compared to 320 K, respectively. The temperature difference for the blank system is 34 K+/31 1 K, and for the bi-strip system, 29 K+/−1 K. This effect is not as pronounced as in the 3-inch bi-strip system, but there were eight bi-strips in the 8-inch system, and three in the 3-inch system. But these strips were spread further apart in the larger system and this arrangement obviously affected the heat transfer efficiency.

Figure 29:
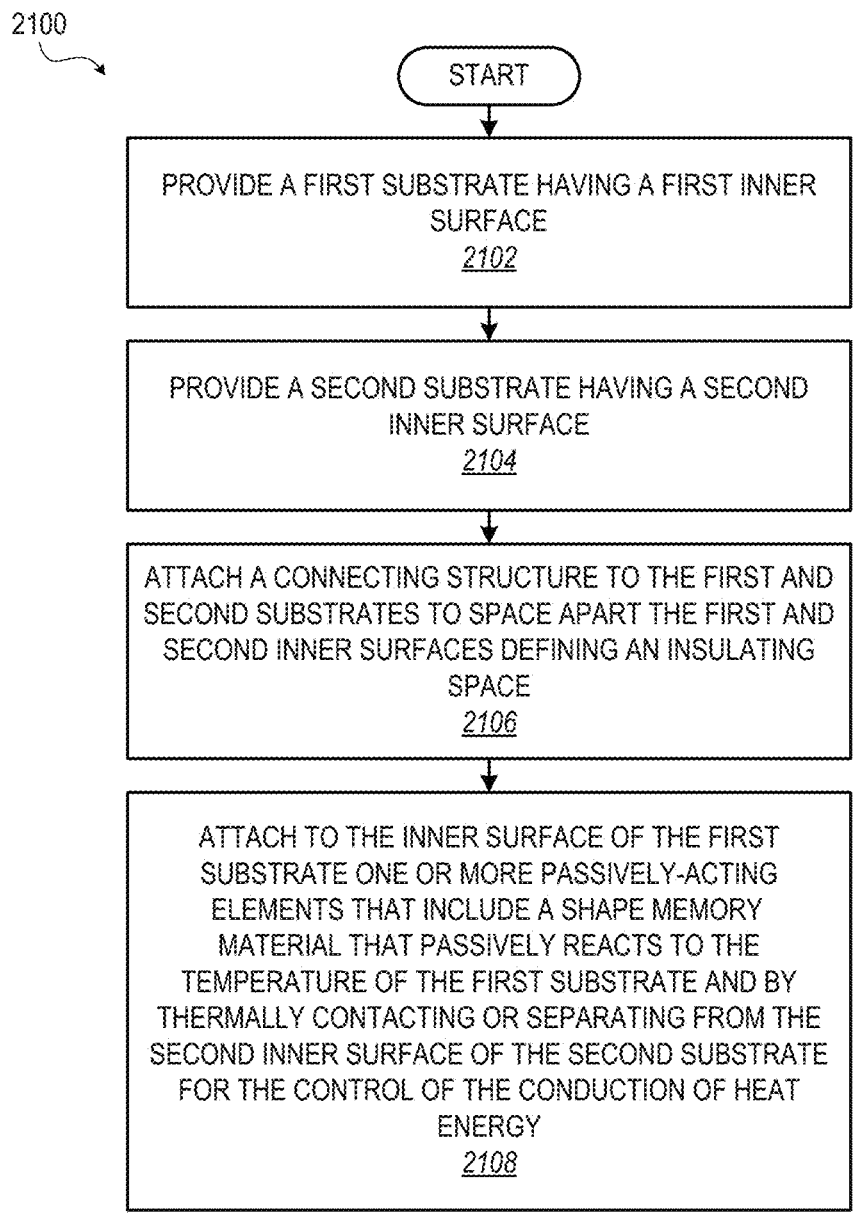
FIG. 29 illustrates a method for providing a transient thermal management system for transferring heat energy between two opposing surface, according to one embodiment.

FIG. 29 illustrates a method 2100 for providing a transient thermal management system for transferring heat energy between two opposing surface. The method 2100 includes providing a first substrate having a first inner surface (block 2102). The method 2100 includes providing a second substrate having a second inner surface (block 2104). The method 2100 includes attaching a connecting structure to the first and second substrates to space apart the first and second inner surfaces defining an insulating space (block 2106). The method 2100 includes attaching to the inner surface of the first substrate one or more passively-acting elements that include a shape memory material that passively reacts to the temperature of the first substrate and by thermally contacting or separating from the second inner surface of the second substrate for the control of the conduction of heat energy (block 2108).

In the above described flow chart of FIG. 29, one or more of the methods may be embodied in an automated manufacturing system that performs a series of functional processes. In some implementations, certain steps of the methods are combined, performed simultaneously or in a different order, or perhaps omitted, without deviating from the scope of the disclosure. Thus, while the method blocks are described and illustrated in a particular sequence, use of a specific sequence of functional processes represented by the blocks is not meant to imply any limitations on the disclosure. Changes may be made with regards to the sequence of processes without departing from the scope of the present disclosure. Use of a particular sequence is therefore, not to be taken in a limiting sense, and the scope of the present disclosure is defined only by the appended claims.

All publications, patents and patent applications cited herein, whether supra or infra, are hereby incorporated by reference in their entirety to the same extent as if each individual publication, patent or patent application was specifically and individually indicated as incorporated by reference. It should be appreciated that any patent, publication, or other disclosure material, in whole or in part, that is said to be incorporated by reference herein is incorporated herein only to the extent that the incorporated material does not conflict with existing definitions, statements, or other disclosure material set forth in this disclosure. As such, and to the extent necessary, the disclosure as explicitly set forth herein supersedes any conflicting material incorporated herein by reference. Any material, or portion thereof, that is said to be incorporated by reference herein, but which conflicts with existing definitions, statements, or other disclosure material set forth herein, will only be incorporated to the extent that no conflict arises between that incorporated material and the existing disclosure material.

It must be noted that, as used in this specification and the appended claims, the singular forms "a," "an" and "the" include plural referents unless the content clearly dictates otherwise. Thus, for example, reference to a "colorant agent" includes two or more such agents.

Unless defined otherwise, all technical and scientific terms used herein have the same meaning as commonly understood by one of ordinary skill in the art to which the invention pertains. Although a number of methods and materials similar or equivalent to those described herein can be used in the practice of the present invention, the preferred materials and methods are described herein.

As will be appreciated by one having ordinary skill in the art, the methods and compositions of the invention substantially reduce or eliminate the disadvantages and drawbacks associated with prior art methods and compositions.

It should be noted that, when employed in the present disclosure, the terms "comprises," "comprising," and other derivatives from the root term "comprise" are intended to be open-ended terms that specify the presence of any stated features, elements, integers, steps, or components, and are not intended to preclude the presence or addition of one or more other features, elements, integers, steps, components, or groups thereof.

As required, detailed embodiments of the present invention are disclosed herein; however, it is to be understood that the disclosed embodiments are merely exemplary of the invention, which may be embodied in various forms. Therefore, specific structural and functional details disclosed herein are not to be interpreted as limiting, but merely as a basis for the claims and as a representative basis for teaching one skilled in the art to variously employ the present invention in virtually any appropriately detailed structure.

While it is apparent that the illustrative embodiments of the invention herein disclosed fulfill the objectives stated above, it will be appreciated that numerous modifications and other embodiments may be devised by one of ordinary skill in the art. Accordingly, it will be understood that the appended claims are intended to cover all such modifications and embodiments, which come within the spirit and scope of the present invention.

We claim:

1. A thermal management system, comprising:
    a first substrate having a first inner surface;
    a second substrate having a second inner surface;
    a connecting structure attached to the first and second substrates to space apart the first and second inner surfaces defining an insulating space that contains one of: (i) a vacuum; and (ii) insulating material to reduce convective heat transfer; and
    one or more passively-acting elements attached to the first inner surface of the first substrate and including a shape memory material that passively reacts to the temperature of the first substrate by thermally transforming from a selected one of to another of a thermally-conductive shape that contacts the second inner surface of the second substrate and a thermally-isolating shape that is spaced apart from the second inner surface for the control of the conduction of heat energy, the one or more passively-acting elements spaced away from any insulating material in the insulating space;
    wherein a pattern of holes in the insulating material is formed as a layer of the insulating material to allow movement respectively of each of the one or more passively-acting elements between the thermally-conductive shape and the thermally-isolating shape.

2. The thermal management system of claim 1, wherein the first substrate is metallic.

3. The thermal management system of claim 2, wherein the second substrate is non-metallic.

4. The thermal management system of claim 3, wherein the second inner surface is thermally conductive.

5. The thermal management system of claim 1, wherein the first substrate is non-metallic and the first inner surface is thermally conductive.

6. The thermal management system of claim 5, wherein the first substrate comprises a ceramic.

7. The thermal management system of claim 5, wherein the first substrate comprises a composite material of textile fibers.

8. The thermal management system of claim 5, wherein the second substrate is non-metallic and the second inner surface is thermally conductive.

9. The thermal management system of claim 8, wherein the second substrate comprises a ceramic.

10. The thermal management system of claim 8, wherein the second substrate comprises a composite material of textile fibers.

11. The thermal management system of claim 1, wherein the shape memory material of the one or more passively-acting elements passively reacts to a nominal temperature of the first substrate by thermally transforming to the thermally-isolating shape that is spaced apart from the second inner surface of the second substrate and passively reacts to an elevated temperature of the first substrate by transforming to the thermally-conducting shape that contacts the second inner surface.

12. The thermal management system of claim 1, wherein the shape memory material of the one or more passively-acting elements passively reacts to a nominal temperature of the first substrate by thermally transforming to the thermally-conducting shape that contacts the second inner surface of the second substrate and passively reacts to an elevated temperature of the first substrate by transforming to the thermally-isolating shape that is spaced apart from the second inner surface.

13. The thermal management system of claim 1, wherein the shape memory material is a shape memory alloy trained to transform at a temperature ranging from $-250°$ C. to $-100°$ C.

14. The thermal management system of claim 1, wherein the shape memory material is a shape memory alloy trained to transform at a temperature ranging from $-99°$ C. to $0°$ C.

15. The thermal management system of claim 1, wherein the shape memory material is a shape memory alloy trained to transform at a temperature ranging from $1°$ C. to $100°$ C.

16. The thermal management system of claim 1, wherein the shape memory material is a shape memory alloy trained to transform at a temperature ranging from $101°$ C. to $250°$ C.

17. The thermal management system of claim 1, wherein the first inner surface of the first substrate further includes a biasing component that at a nominal temperature range restores the shape memory material, comprised of a shape memory alloy, to the selected one of the thermally-isolating shape and the thermally-conducting shape as the passive-acting element transitions below a transformation temperature.

18. The thermal management system of claim 17, wherein the shape memory alloy comprises the biasing component by being further trained for two-way shape memory effect.

19. The thermal management system of claim 17, wherein the biasing component comprises a spring member.

20. The thermal management system of claim 17, wherein the biasing component comprises a second passive-acting element comprising a superelastic shape memory alloy that is utilized to restore the passive-acting element during a thermal transition below the transformation temperature.

21. The thermal management system of claim 1, wherein the first and second substrates comprise parallel plates that are attached to form a panel.

22. The thermal management system of claim 1, wherein the first and second substrates comprise curved shapes that are attached to form a panel.

23. The thermal management system of claim 1, wherein the passive-acting element further comprises a thermally-conductive rope member having one end attached to the first inner surface of the first substrate and having another end attached to an apex portion of the passive-acting element that contacts the second inner surface of the second substrate, the thermally-conductive rope member being flexibly positioned by the passive-acting element.

24. The thermal management system of claim 1, wherein the passive-acting element comprises the shape memory material, comprised of a shape memory alloy, formed into a coil spring.

25. The thermal management system of claim 24, further comprising a spring guide attached to the first inner surface of the first substrate to laterally guide the coil spring.

26. The thermal management system of claim 1, further comprising a thermally conductive plate member attached on top of the passive-acting element to increase thermal contact with the second inner surface of the second substrate.

27. The thermal management system of claim 1, wherein the insulating space contains a vacuum.

28. The thermal management system of claim 1, wherein:
the pattern of holes are each shaped to closely fit the passively-acting elements; and
the insulating material substantially fills the insulating space.

29. The thermal management system of claim 1, wherein:
the one or more passively-acting elements each comprise a finger shape having one end attached to the first inner surface of the first substrate and having an unattached end that moves between contacting and non-contacting positions with the second inner surface; and
the pattern of holes comprises a finger pattern of holes.

30. The thermal management system of claim 1, wherein the one or more passively-acting elements each comprise a finger shape having one end attached to the first inner surface of the first substrate and having an unattached end that moves between contacting and non-contacting positions with the second inner surface.

* * * * *